US009373786B1

(12) United States Patent
Kamalanathan et al.

(10) Patent No.: US 9,373,786 B1
(45) Date of Patent: Jun. 21, 2016

(54) TWO TERMINAL RESISTIVE ACCESS DEVICES AND METHODS OF FORMATION THEREOF

(71) Applicant: Adesto Technologies Corporation, Sunnyvale, CA (US)

(72) Inventors: Deepak Kamalanathan, Santa Clara, CA (US); Foroozan Sarah Koushan, San Jose, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 403 days.

(21) Appl. No.: 13/748,470

(22) Filed: Jan. 23, 2013

(51) Int. Cl.
*H01L 47/00* (2006.01)
*H01L 45/00* (2006.01)
(52) U.S. Cl.
CPC ............ *H01L 45/1253* (2013.01); *H01L 45/12* (2013.01); *H01L 45/16* (2013.01)
(58) Field of Classification Search
CPC .................... H01L 45/085; H01L 45/1233
USPC .......................................................... 257/4
See application file for complete search history.

(56) References Cited

U.S. PATENT DOCUMENTS

| 6,847,047 | B2 | 1/2005 | VanBuskirk et al. | |
| 7,035,141 | B1 | 4/2006 | Tripsas et al. | |
| 7,440,308 | B2 * | 10/2008 | Jeong et al. | 365/148 |
| 7,579,631 | B2 | 8/2009 | Gaun et al. | |
| 7,981,773 | B2 | 7/2011 | Krieger et al. | |
| 8,203,863 | B2 | 6/2012 | Kim et al. | |
| 2006/0141713 | A1 * | 6/2006 | Happ et al. | 438/275 |
| 2008/0232160 | A1 | 9/2008 | Gopalakrishnan | |
| 2009/0065757 | A1 * | 3/2009 | Sawa | G11C 13/0007 257/4 |

OTHER PUBLICATIONS

Arantani, K., et al., "A Novel Resistance Memory with High Scalability and Nanosecond Switching," Electron Devices Meeting 2007, Washington, D.C., Dec. 2007, IEEE International, pp. 783-786.
Burr, G.W., et al., "Larce-scale (521kbit) integration of Multilayer-ready Access-Devices based on Mixed-Ionic-Electronic-Conduction (MIEC) at 100% yield," 2012 Symposium on VLSI Technology Digest of Technical Papers, IEEE 2012, pp. 41-42.
Chen, A., "Status and Challenges in Ionic Memories," Strategic Technology Group, AMD, Nov. 12, 2008, 34 pages.
Gopalakrishnan, K., et. al., "Highly-Scalable Novel Access Device based on Mixed Ionic Electronic Conduction (MIEC) Materials for High Density Phase Change Memory (PCM) Arrays," 2010 Symposium on VLSI Technology Digest of Technical Papers, IEEE 2010, pp. 205-206.
Hisashi, S., et al., "Basics of RRAM based on transition metal oxides," International Symposium on Advanced Gate Stack Technoloy, Sep. 29-Oct. 1, 2010, 25 pages.
Jo, S.H., et al., "High-Density Crossbar Arrays Based on a Si Memristive System," Nano Letters, ACS Publications, Washington , DC., Jan. 21, 2009, 6 pgs.

(Continued)

*Primary Examiner* — Samuel Gebremariam
(74) *Attorney, Agent, or Firm* — Slater Matsil, LLP

(57) ABSTRACT

In accordance with an embodiment of the present invention, a memory cell includes a two terminal access device disposed above a semiconductor substrate. The access device includes a two terminal resistive switching device having substantially zero retention. The two terminal resistive switching device has a low resistance state and a high resistance state. A memory device is disposed above the semiconductor substrate. The memory device is coupled to the access device.

13 Claims, 24 Drawing Sheets

(56) References Cited

OTHER PUBLICATIONS

Jo, S.H., "Nanoscale Memristive Devices for Memory and Logic Applications," Dissertation submitted in partial fulfillment of the requirements for the degree of Doctor Philosphy, University of Michigan, 2010, 153 pages.

Kim, K-H., et al., "A Functional Hybrid Memristor Crossbar-Array/CMOS System for Data Storage and Neuromorphic Applications," Nano Letters, ACS Publications, 2012, pp. 389-395.

Kozicki, M.N., et al., "Non-Volatile Memory Based on Solid Electrolytes," Axon Technologies Coporation, Tempe, Arizona, 2004, pp. 1-8.

Makarov, A., et al., "Emerging memory technologies: Trends, challenges, and modeling methods," Microelectronics Reliability 52, 2012, pp. 628-634.

Shenoy, R.S., et al., "Endurance and Scaling Trends of Novel Access-Devices for Multi-Layer Crosspoint-Memory based on Mixed-Ionic-Electronic-Conduction (MIEC) Materials," Symposium on VLSI Technology Digest of Technical Papers, 2011, pp. 94-95.

Valov, I., et al., "Electrochemical Metallization memories-fundamentals, applications, prospects," Nanotechnology, 2011, 23 pages.

Waser, "Resistive Non-Volatile Memory Devices (Invited Papers)," ScienceDirect, Microelectronic Engineering 86, Mar. 2009, Elsevier B.V., pp. 1925-1928.

Wikipedia, "DIAC," en.wikipedia.org/wiki/DIAC, 3 pgs.

Wikipedia, "TRIAC," en.wikipedia.org/wiki/TRIAC, 10 pgs.

"Why CMOx™ Cross-Point Memory Arrays?" Unity Semiconductor, Sunnyvale, CA, 7 pages.

Wong, "Emerging Memories," Department of Electrical Engineering, Stanford University, Presentation, Apr. 2008, 77 pages.

Wong, et al., "Phase Change Memory," Proceedings of the IEEE, vol. 98, No. 12, Dec. 2010, IEEE, pp. 2201-2227.

"Chaper 4. Switch Realization," Fundamentals of Power Electronics, 77 pgs.

\* cited by examiner

TWO TERMINAL RESISTIVE ACCESS DEVICES AND METHODS OF FORMATION THEREOF

TECHNICAL FIELD

The present invention relates generally to electronic devices, and more particularly to two terminal resistive access devices and methods of formation thereof.

BACKGROUND

Semiconductor industry relies on device scaling to deliver improved performance at lower costs. Flash memory is the mainstream non-volatile memory in today's market. However, Flash memory has a number of limitations that is posing a significant threat to continued advancement of memory technology. Therefore, the industry is exploring alternative memories to replace Flash memory. Contenders for future memory technology include magnetic storage random access memory (MRAM), ferroelectric RAM (FeRAM), and resistive switching memories such as phase change RAM (PCRAM), resistive RAM (RRAM), ionic memories including programmable metallization cell (PMC) or conductive bridging random access memory (CBRAM). These memories are also called as emerging memories.

SUMMARY OF THE INVENTION

In accordance with an embodiment of the present invention, a memory cell comprises a two terminal access device disposed above a semiconductor substrate. The access device comprises a two terminal resistive switching device having substantially zero retention. The two terminal resistive switching device has a low resistance state and a high resistance state. A memory device is disposed above the semiconductor substrate. The memory device is coupled to the access device.

In accordance with an embodiment of the present invention, a device array comprises a first conductor oriented along a first direction, a second conductor oriented along a second direction perpendicular to the first direction, a first two terminal resistive switching device having a cathode terminal and an anode terminal, and a second two terminal resistive switching device having a cathode terminal and an anode terminal. The device array further includes a memory device having a first node and a second node. The first node is coupled to the cathode terminal of the first two terminal resistive switching device and the anode terminal of the second two terminal resistive switching device. The second node is coupled to the second conductor. The anode terminal of the first two terminal resistive switching device and the cathode terminal of the second two terminal resistive switching device are coupled to the first conductor. The second node of the memory device is coupled to the second conductor.

In accordance with an embodiment of the present invention, a switching device comprises a memory device disposed over a substrate, and a two terminal access device disposed over the substrate and coupled to the memory device. The access device comprises a two terminal resistive switching device. The two terminal resistive switching device comprises an active electrode layer, an inert electrode layer, a switching layer disposed between the active electrode layer and the inert electrode layer, and a tunneling layer disposed between the active electrode layer and the inert electrode layer.

In accordance with an embodiment of the present invention, a method of forming a device array comprises forming a first conductor oriented along a first direction over a semiconductor substrate and forming a first two terminal resistive switching device having a cathode terminal and an anode terminal over the first conductor. The method further includes forming a second two terminal resistive switching device having a cathode terminal and an anode terminal over the first conductor. The anode terminal of the first two terminal resistive switching device and the cathode terminal of the second two terminal resistive switching device are coupled to the first conductor. A memory device having a first node and a second node is formed over the first and the second two terminal resistive switching devices. The first node to the cathode terminal of the first two terminal resistive switching device is coupled to the anode terminal of the second two terminal resistive switching device. A second conductor is formed over the memory device. The second conductor is oriented along a second direction perpendicular to the first direction. The second node of the memory device is coupled to the second conductor.

In accordance with an embodiment of the present invention, a method of forming a switching device comprises forming a memory device over a substrate and forming a two terminal access device over the substrate and coupled to the memory device. In one embodiment, forming the two terminal access device comprises forming an inert electrode layer over the substrate, forming a switching layer over the inert electrode layer, forming an active electrode layer, and forming a tunneling layer disposed between the active electrode layer and the inert electrode layer.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1D, illustrates cross-sectional view and operation of a prior art resistive switching memory, wherein FIG. 1A illustrates a cross-sectional view of a conventional ionic memory, wherein FIG. 1B illustrates the memory under a programming operation, wherein FIG. 1C illustrates the memory under an erase operation, and wherein FIG. 1D illustrates a corresponding current voltage behavior of a prior art resistive switching memory;

FIG. 4, which includes FIGS. 4A-4C, illustrates a non-linear bidirectional resistive switching device having positive and negative threshold voltages in accordance with embodiments of the present invention, wherein FIG. 4A illustrates a circuit schematic of two non-linear resistive switching devices having significantly reduced memory retention connected in anti-parallel, wherein FIG. 4B illustrates the individual current-voltage characteristics of the two non-linear resistive switching devices, and wherein FIG. 4C illustrates a current-voltage characteristic of a bidirectional resistive switching device formed using the two non-linear resistive switching devices having significantly reduced memory retention connected in anti-parallel;

FIG. 5, which includes FIGS. 5A and 5B, illustrates a unidirectional resistive switching device with negligible retention due to a thick switching layer in accordance with an embodiment of the invention, wherein FIG. 5A illustrates a cross-sectional view of the unidirectional resistive switching device while FIG. 5B illustrates the retention as a function of the thickness of the switching layer of the unidirectional resistive switching device;

FIG. 6, which includes FIGS. 6A and 6B, illustrates a unidirectional resistive switching device with negligible retention due to a high concentration of conductive nanophases in the switching layer in accordance with an embodiment of the invention, wherein FIG. 6A illustrates a cross-sectional view of the unidirectional resistive switching device while FIG. 6B illustrates retention as a function of fractional active atomic concentration within the switching layer of the unidirectional resistive switching device;

FIG. 7, which includes FIGS. 7A-7F, illustrates cross-sectional views of a unidirectional resistive switching device having a tunneling layer in accordance with an embodiment of the invention, wherein FIGS. 7A-7E illustrates a cross-sectional views of a unidirectional resistive switching device while FIG. 7F illustrates the current voltage relationship of the tunneling layer relative to the resistive switching layer;

FIG. 8, which includes FIGS. 8A and 8B, illustrates a cross point device array in accordance with embodiments of the present invention, wherein FIG. 8A illustrates a top view and FIG. 8B illustrates a cross-sectional view;

FIG. 9, which includes FIGS. 9A and 9B, illustrates cross-sectional views of the cross-point device array in accordance with embodiments of the invention, wherein FIG. 9A illustrates a unidirectional switching device while FIG. 9B illustrates a bidirectional switching device;

FIG. 10, which includes FIGS. 10A and 10B, illustrates a cross-point memory array during operation in accordance with embodiments of the present invention, wherein FIG. 10A illustrates a read operation while FIG. 10B illustrates a write operation;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely ionic memories such as conductive bridging memories. The invention may also be applied, however, to other types of memories, particularly, to any resistive memory such as two terminal resistive memories. Although described herein for a memory device, the embodiments of the invention may also be applied to other types of devices formed by resistive switching such as processors, dynamically-reroutable electronics, optical switches, field-programmable gate arrays, and microfluidic valves as well as other nanoionic devices.

Figure 1A:
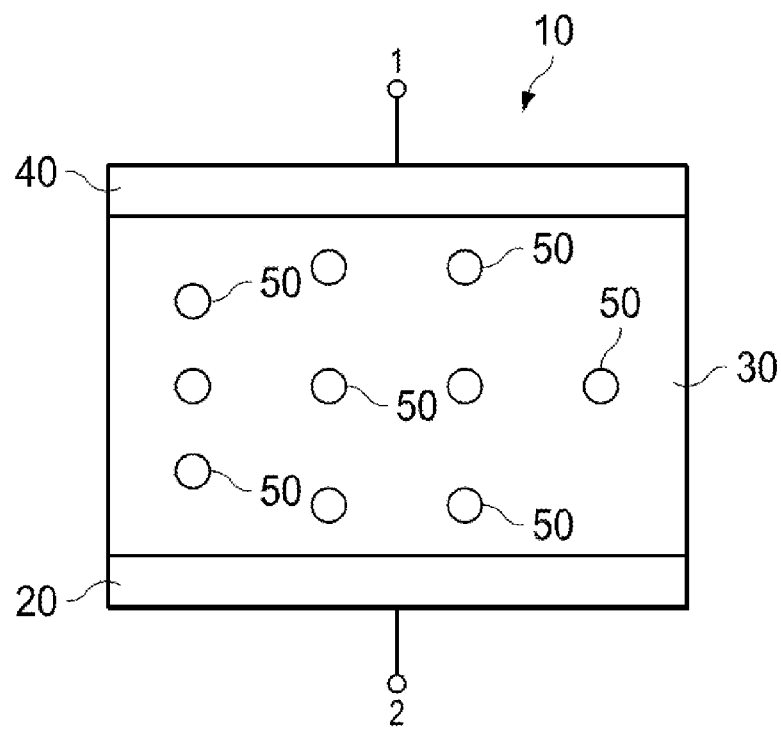
Figure 1B:
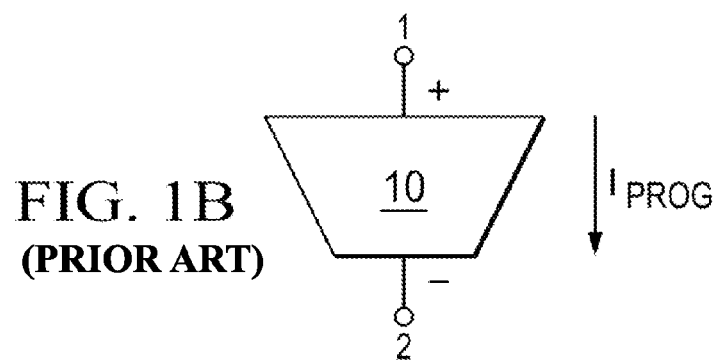
Figure 1C:
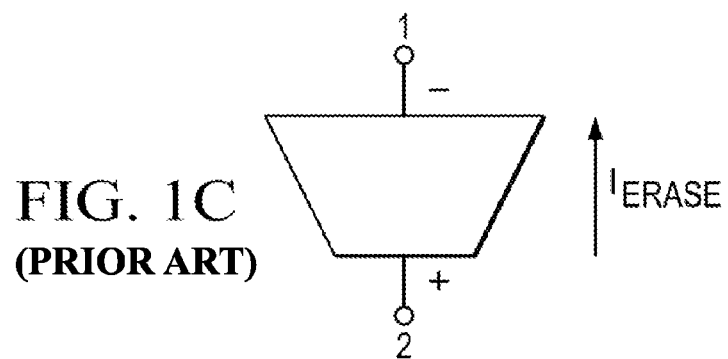
Figure 1D:
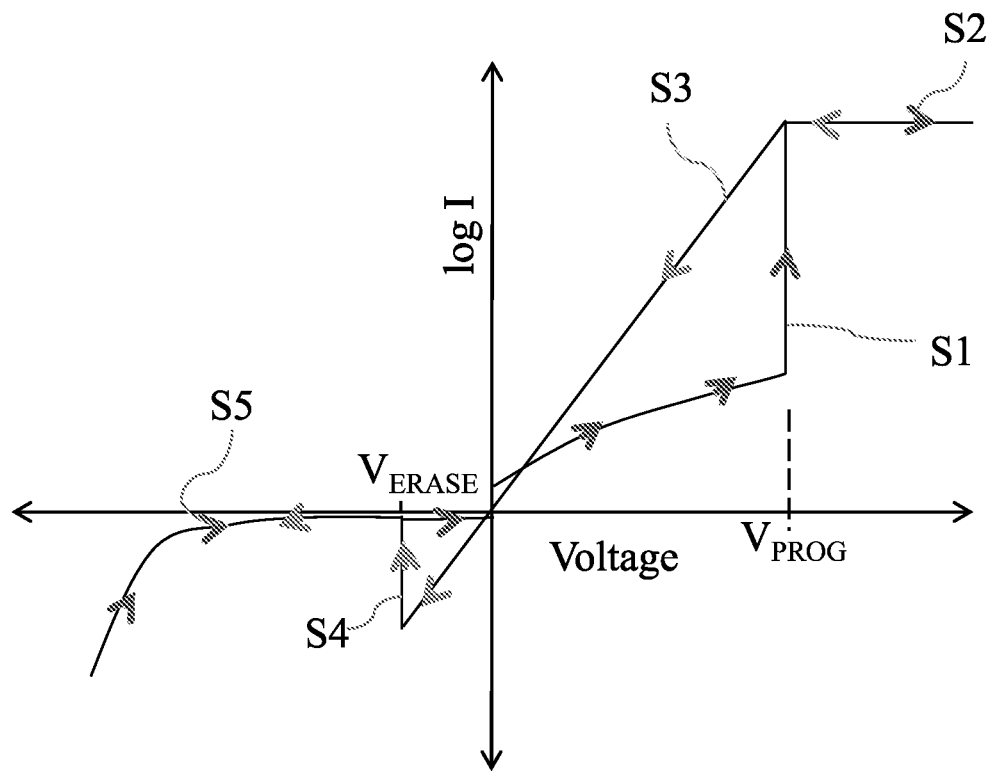

FIG. 1, which includes FIGS. 1A-1D, illustrates cross-sectional view and operation of a prior art resistive switching memory, wherein FIG. 1A illustrates a cross-sectional view of a conventional ionic memory, wherein FIG. 1B illustrates the memory under a programming operation, wherein FIG. 1C illustrates the memory under an erase operation, and wherein FIG. 1D illustrates a corresponding current voltage behavior of the prior art resistive switching memory.

FIG. 1A illustrates a memory unit 10 having a variable resistance layer 30 placed between a first conductive layer 20 and a second conductive layer 40. The variable resistance layer 30 may be a solid electrolyte layer that is programmable, for example, by the application of external stimuli such as electric potential, heat, magnetic field, and others. In other words, the resistance across the variable resistance layer 30 may be changed by the application of a program operation and a corresponding erase operation. For example, after a program operation, the variable resistance layer 30 has a low resistance (ON state) whereas after an erase operation, the variable resistance layer 30 has a high resistance (OFF state). The operation of the memory cell involves nano-scale migration and rearrangement of conductive atoms such as metal atoms through the variable resistance layer 30. Alternatively, the memory cell may operate due to the motion of defects such as point defects within the variable resistance layer 30. The program/erase operations may be performed by applying an electrical signal between a first node 1 and a second node 2.

As illustrated in FIG. 1A, nanophases 50 may be disbursed within the variable resistance layer 30. The nanophases 50 may be conductive. However, the resistivity of this variable resistance layer 30 in the OFF state is high, for example, greater than 500MΩ and depends on the cell area. The resistivity state of the memory cell can be read by applying a read voltage between the first and the second nodes 1 and 2. However, the read voltage is negligible (typically about −200 mV to about 200 mV) and does not change the state of the memory cell.

FIG. 1B illustrates the prior art memory unit during a conventional program operation. The programming operation may be accomplished using a static voltage or a dynamic pulse. Typically programming is performed using a programming pulse, which applies a potential difference between the first node 1 and the second node 2.

When a positive voltage is applied across the first and the second nodes 1 and 2 as illustrated in FIG. 1B, conductive atoms from the second conductive layer 40 may be oxidized forming conductive ions, which are then accelerated due to the electric field in the variable resistance layer 30. The programming pulse, e.g., depending on the variable resistance layer 30, may have a potential $V_{PROG}$ higher than the threshold voltage, which is about 300 mV or higher and typically about 450 mV in one example. For example, the programming pulse may have a potential $V_{PROG}$ of about 1 V to about 1.5V. The conductive ions drift towards the first conductive layer 20, which may be the cathode. Within the variable resistance layer 30, the conductive ions may migrate using nanophases 50, which may absorb a drifting conductive ion and release the same or another conductive ion. Eventually, a conductive ion close to the first conductive layer absorbs an electron from the second node 2 and is reduced back to a conductive atom. The reduced conductive atom is deposited over the first conductive layer 20.

During the programming pulse, more and more conductive ions are brought from the second conductive layer 40 to the first conductive layer 20, which eventually results in the formation of a conductive filament within the variable resistance layer 30. The flow of the conductive ions also results in the flow of the programming current $I_{PROG}$ through the variable resistance layer 30. After the bridging of the first conductive layer 20 with the second conductive layer 40 through the variable resistance layer 30, the resistivity of the variable resistance layer 30 drops significantly and may be measured/read using a read operation.

FIG. 1C illustrates the prior art memory unit during a conventional erase operation. The erase operation may be accomplished using a static voltage or a dynamic pulse. Typically erasure is performed using an erase pulse, which applies a potential difference (opposite to the program pulse) between the first node 1 and the second node 2.

When a negative voltage is applied across the first and the second nodes 1 and 2 as illustrated in FIG. 1C, conductive atoms in the conductive filament formed previously get oxidized to conductive ions, which drift to the second conductive layer 40 due to the electric field. At the second conductive layer 40, these conductive ions absorb electrons from the first node 1 and are reduced to conductive atoms reforming the initial high resistivity state. The flow of the conductive ions towards the second conductive layer 40 results in the flow of the erase current $I_{ERASE}$ through the variable resistance layer 30. Unlike the second conductive layer 40, the first conductive layer 20 is inert and therefore does not contribute conductive atoms. Therefore, the erase process terminates upon the relocation of all the conductive atoms within the variable resistance layer 30.

FIG. 1D illustrates a current voltage relationship of a prior art resistive switching device.

When a positive voltage is applied across the resistive switching device, as described above, the formation of a conductive pathway, e.g., filament (or other means of conduction) begins. The increase in the number of conductive atoms within the variable resistance layer 30 results in an increase in current flowing through the variable resistance layer 30 as illustrated by section 1 (S1) of the I-V relationship. After the voltage reaches a critical value sufficient to create a stable conductive pathway, the resistance across the variable resistance layer 30 dramatically reduces, for example, to the resistance of the conductive pathway. Subsequently, the current increases linearly with the applied voltage with the slope indicating the resistance of the conductive pathway until the current compliance is reached as illustrated by section 2 (S2).

As next illustrated in section 3 (S3), when the voltage across the resistive switching device is reduced, the current flowing through the variable resistance layer 30 decreases linearly according to the resistance of the conductive pathway. The current-voltage relationship does not follow the curve S1 due to the presence of the conductive pathway (conductive filament). Subsequently, referring to section 4 (S4), when the voltage is dropped below the erase voltage ($V_{ERASE}$), the conductive pathway dissolves due to the migration of the conductive ions back into the second conductive layer 40.

After the conductive pathway is removed/erased, the resistance of the variable resistance layer 30 increases dramatically (evidenced by the small slopes). If the negative voltage is increased continuously, the variable resistance layer 30 may eventually breakdown as illustrated by the section 5 (S5).

Consequently, the prior art resistive switching device exhibits a hysteresis, which is critical for a memory device. The hysteresis allows the device to switch and maintain a low resistance state and a high resistance state, which may be detected by applying an intermediate voltage between the erase voltage ($V_{ERASE}$) and the program voltage ($V_{PROG}$). As a consequence, the hysteresis of the device enables retention of data.

Embodiments of the present invention describe a resistive switching device having no significant hysteresis or negligible retention. Such devices may be used as access devices in conjunction with other memory devices. For example, the footprint of a prior art memory cell having a conventional resistive switching device and an access device (1T-1R configuration) depends on the size of the access device. Prior art access devices are formed in semiconductor substrate and are three terminal field effect transistors, which take more area than the corresponding resistive switching memory device. Further, the need for the access device to be at the substrate level limits the formation of a multi-layer memory stack, e.g., cross-point array stacks. In various embodiments, the access device comprises a resistive switching device having no retention. Accordingly, in various embodiments, the resistive switching device operates like a switch with no memory.

A functional illustration of the hysteresis free bidirectional resistive switching device will be described using FIG. 2. A functional illustration of a resistive switching device having negligible retention will be described using FIG. 3. A functional illustration of a bidirectional resistive switching device having negligible retention will be described using FIG. 4. Structural embodiments of a resistive switching device having negligible retention will be described using FIGS. 5-7. Embodiments of a cross-point device array will be described using FIGS. 8-10. A method of fabricating the resistive switching device will be described using FIG. 11. A system comprising embodiments of the present invention will be described using FIG. 12.

Figure 2:
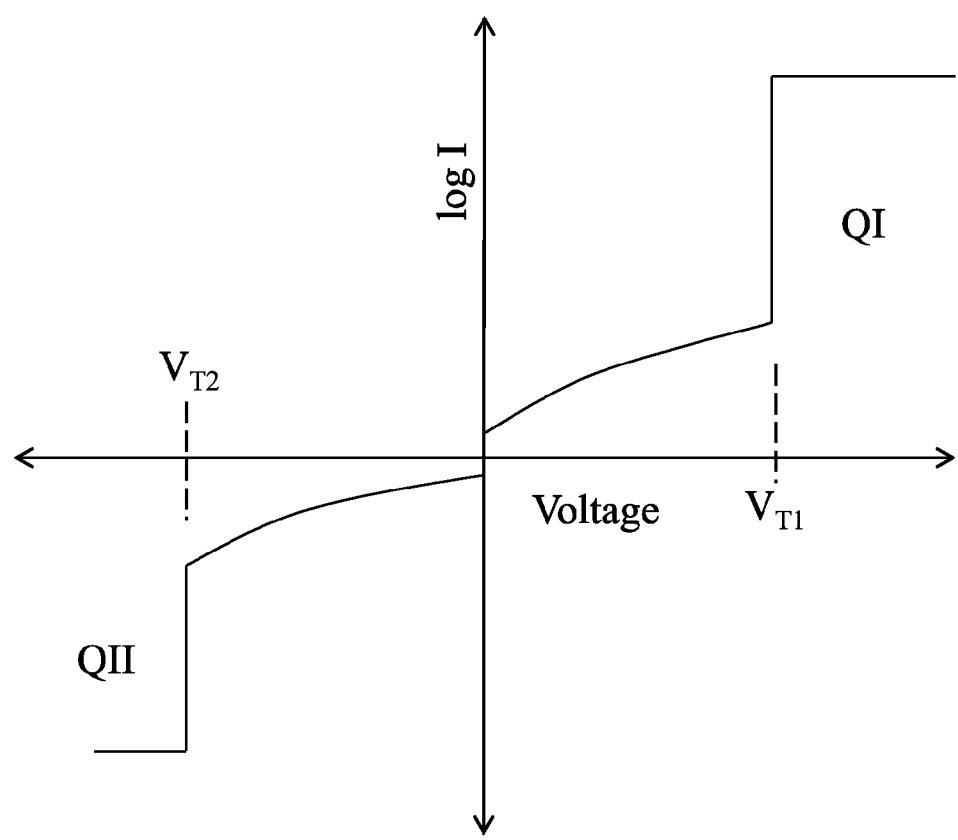
FIG. 2 illustrates a non-linear bidirectional resistive switching device having no memory retention in accordance with an embodiment of the present invention.

FIG. 2 illustrates a non-linear bidirectional resistive switching device having no memory retention in accordance with an embodiment of the present invention.

Unlike a prior art resistive switching device, the current-voltage relationship of a non-linear resistive switching device is illustrated in accordance with embodiments of the present invention.

As illustrated in FIG. 2, the non-linear resistive switching device has a first threshold voltage ($V_{T1}$) when a positive voltage is increased. During a program operation, as the voltage is increased, the current flowing across the resistive switching device increases slowly until the first threshold voltage ($V_{T1}$). When the voltage is increased beyond the first threshold voltage ($V_{T1}$), the current flowing through the resistive switching device increases abruptly due to the formation of a low resistance conductive path.

Up to this point, the operation of the resistive switching device is similar to a prior art resistive switching device. However, after programming, when the voltage across the resistive switching device is reduced below the first threshold voltage ($V_{T1}$), the resistive switching device according to embodiments of the present invention behaves differently from the prior art devices.

As illustrated in FIG. 2, the erase voltage and the program voltage are identical. Therefore, reducing the voltage below the first threshold voltage ($V_{T1}$) results in removal of the first conductive pathway within the resistive switching device. This results in a significant increase in resistance.

Subsequently, as the voltage is reduced below a second threshold voltage ($V_{T2}$), another conductive pathway is formed within the resistive switching device. As a consequence, below the second threshold voltage, the resistive switching device exhibits a low resistance state.

Similarly, if, however, the voltage is increased (more positive) above the second threshold voltage ($V_{T2}$), the second conductive pathway is erased as the resistive switching devices switches to a high resistance state.

Accordingly, in various embodiments, the resistive switching device is a bidirectional device. In a first quadrant QI, the bidirectional device conducts in a first direction if a positive potential above the first threshold voltage ($V_{T1}$) is applied. However, in a second quadrant QII, the bidirectional device conducts in a second direction (opposite the first direction) if a negative potential below the second threshold voltage ($V_{T2}$) is applied.

In various embodiments, the first conductive path and the second conductive path may be different. In one embodiment, the first conductive path and the second conductive path may be formed in different current paths. In one or more embodiments, the first and the second conductive path may be formed in different regions of the bidirectional device, for example.

In various embodiments, the above described resistive switching device may be used as an access transistor in a memory array. In various embodiments, the resistive switching device may be formed within metallization levels above the semiconductor substrate and may be used as an access device within a cross-point device array.

Figure 3:
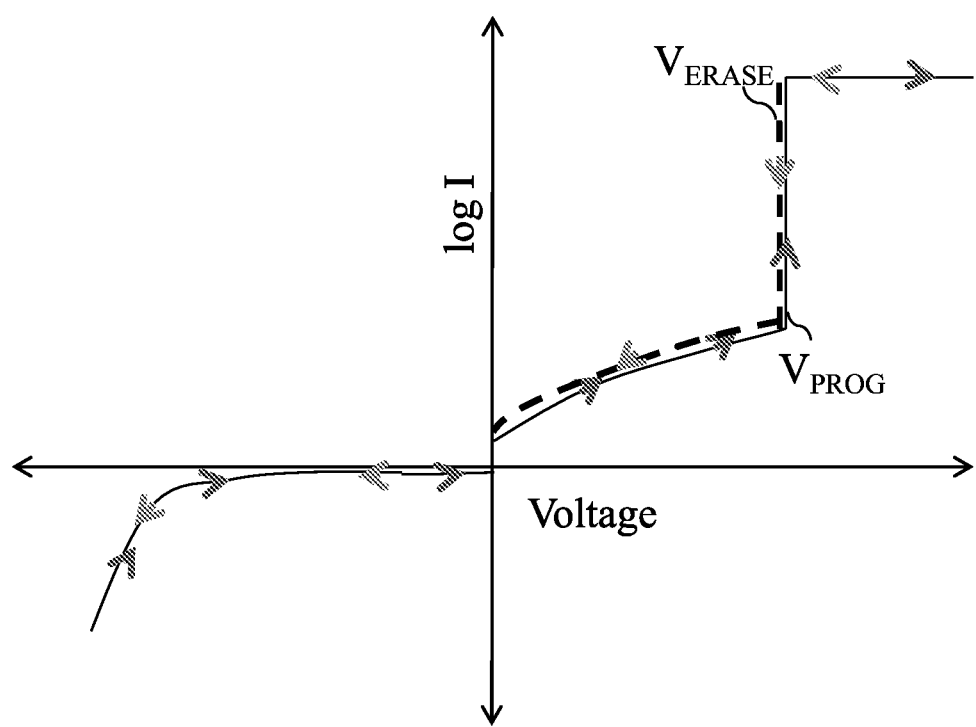
FIG. 3 illustrates a non-linear unidirectional resistive switching device having significantly reduced memory retention in accordance with an embodiment of the present invention.

FIG. 3 illustrates a non-linear unidirectional resistive switching device having significantly reduced memory retention in accordance with an embodiment of the present invention.

Embodiments of the present invention include resistive switching devices having poor retention as described with respect to FIG. 3. As illustrated in FIG. 3, in one or more embodiments, the resistive switching device may have a program voltage ($V_{PROG}$) after which the resistive switching device switches to a low resistance state.

As further illustrated in FIG. 3, the erase voltage ($V_{ERASE}$) is similar to the program voltage ($V_{PROG}$). In various embodiments, the erase voltage ($V_{ERASE}$) is below the program voltage ($V_{PROG}$) by about 10 mV to about 200 mV. In one or more embodiments, the erase voltage ($V_{ERASE}$) is below the program voltage ($V_{PROG}$) by about 10 mV to about 100 mV. In some embodiments, the erase voltage ($V_{ERASE}$) is below the program voltage ($V_{PROG}$) by about 10 mV to about 50 mV.

In further embodiments, the erase voltage ($V_{ERASE}$) is below the program voltage ($V_{PROG}$) by up to about 200 mV. In alternative embodiments, the erase voltage ($V_{ERASE}$) is below the program voltage ($V_{PROG}$) by up to about 50 mV.

As illustrated in FIG. 3, after the erasure, the resistive switching device has a low resistance state. However, if the negative voltage across the resistive switching device is increased beyond a break down voltage, the resistive switching device breaks down resulting in an increase in current. The breakdown may be a hard breakdown in which the device will not function subsequently (e.g., due to formation of a permanent conductive path) or may also be a soft breakdown after which the device may function although perhaps not at the same operating parametrics.

As a consequence, the embodiment described in FIG. 3 is a unidirectional switch and not a bidirectional switch as described in FIG. 2.

Figure 4C:
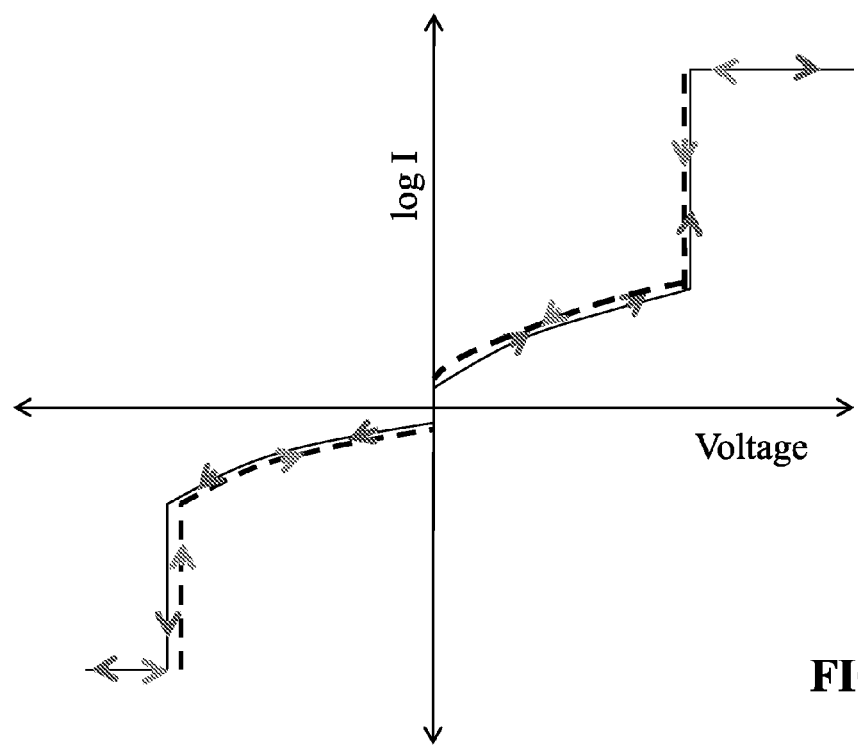
Figure 4A:
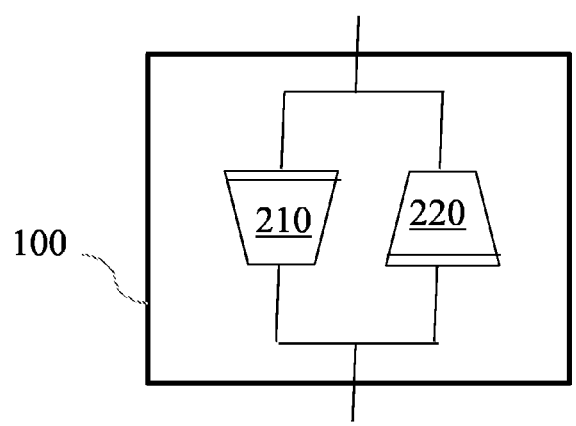
Figure 4B:
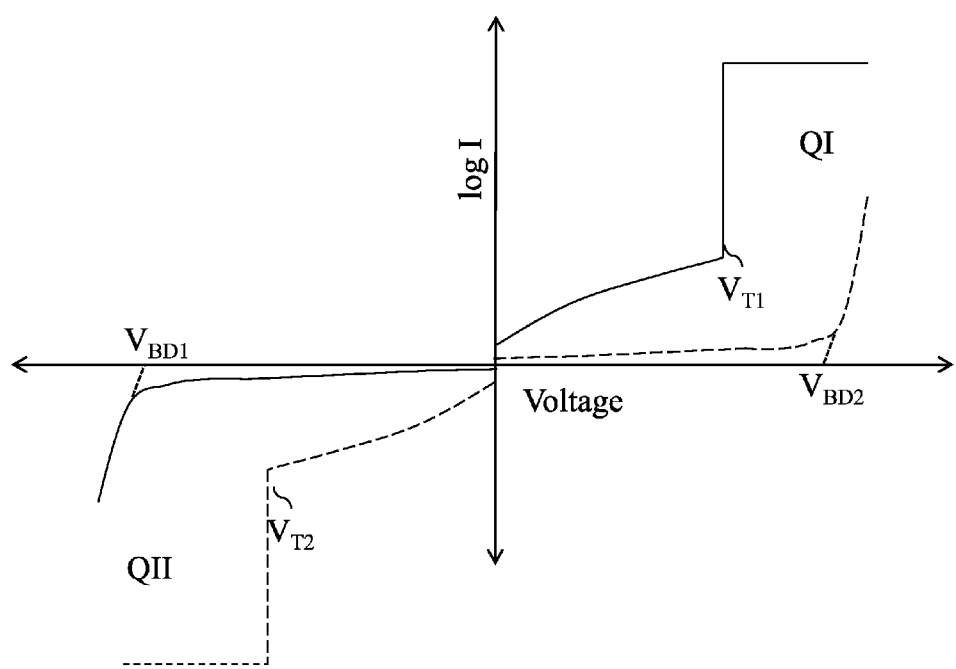

FIG. 4, which includes FIGS. 4A-4C, illustrates a non-linear bidirectional resistive switching device having positive and negative threshold voltages in accordance with embodiments of the present invention. FIG. 4A illustrates a circuit schematic of two non-linear resistive switching devices having significantly reduced memory retention connected in anti-parallel. FIG. 4B illustrates the individual current-voltage characteristics of the two non-linear resistive switching devices. FIG. 4C illustrates a current-voltage characteristic of a bidirectional resistive switching device formed using two non-linear resistive switching devices having significantly reduced memory retention connected in anti-parallel in accordance with an embodiment of the present invention.

As illustrated in FIG. 4A, a bidirectional resistive switching device 100 may include a first unidirectional resistive switching device 210 and a second unidirectional resistive switching device 220. The first unidirectional resistive switching device 210 and a second unidirectional resistive switching device 220 are connected in anti-parallel. Therefore, the anode of the first unidirectional resistive switching device 210 is coupled to a cathode of the second unidirectional resistive switching device 220. Similarly, the cathode of the first unidirectional resistive switching device 210 is coupled to the anode of the second unidirectional resistive switching device 220.

In various embodiments, individually, the first unidirectional resistive switching device 210 and the second unidirectional resistive switching device 220 behave similar to the unidirectional resistive device described in FIG. 3. However, when connected in anti-parallel, the first unidirectional resistive switching device 210 and the second unidirectional resistive switching device 220 form a bidirectional device.

As illustrated in FIG. 4B, when the first unidirectional resistive switching device 210 is forward biased (i.e., positive potential at the anode), the second unidirectional resistive switching device 220 is reverse biased (i.e., negative potential at the anode). Therefore, effectively, the first unidirectional resistive switching device 210 has a current-voltage characteristic illustrated by the solid lines (for sake of clarity the erase and program characteristics are not separately shown). Due to the anti-parallel connection, the second unidirectional resistive switching device 220 feels an equal and opposite potential. Therefore, effectively, the second unidirectional resistive switching device 220 has a current-voltage characteristic illustrated by the dashed lines.

In various embodiments, the first unidirectional resistive switching device 210 and the second unidirectional resistive switching device 220 are selected to ensure that the first breakdown voltage ($V_{BD1}$) of the first unidirectional resistive switching device 210 is more negative than the threshold voltage ($V_{T2}$) of the second unidirectional resistive switching device 220. Similarly, the second breakdown voltage ($V_{BD2}$) of the second unidirectional resistive switching device 220 is more positive than the threshold voltage ($V_{T1}$) of the first unidirectional resistive switching device 210.

Consequently, the current-voltage characteristics of the combined resistive switching device 100 is dominated by the first unidirectional resistive switching device 210 in the first quadrant QI while the second unidirectional resistive switching device 220 dominates the current-voltage characteristics of the combined resistive switching device 100 in the second quadrant QII.

The current-voltage characteristics of the combined resistive switching device 100 is illustrated in FIG. 4C, which also includes the erase and program pathways. Here, the solid lines indicate the current-voltage relationship during programming (positive and negative) while the dashed lines indicate the current-voltage relationship during erasure (positive and negative).

Figure 5A:
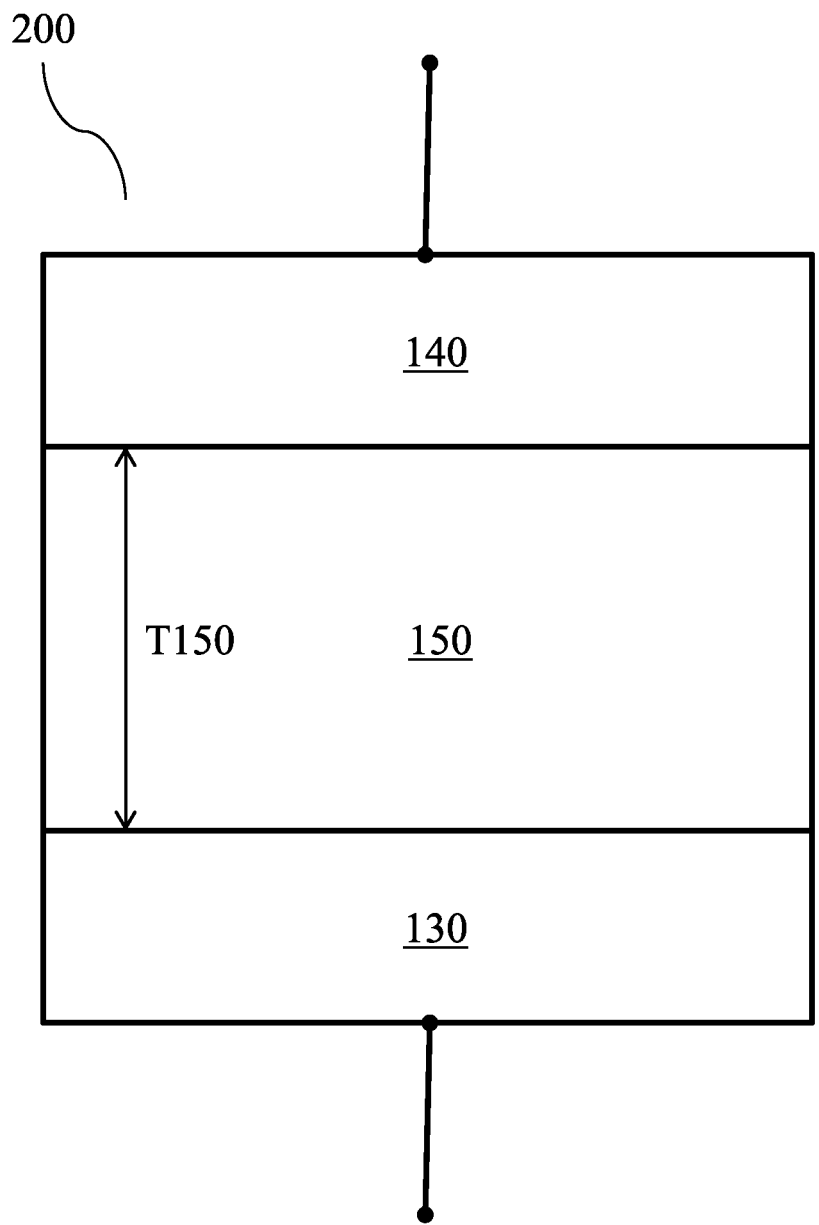
Figure 5B:
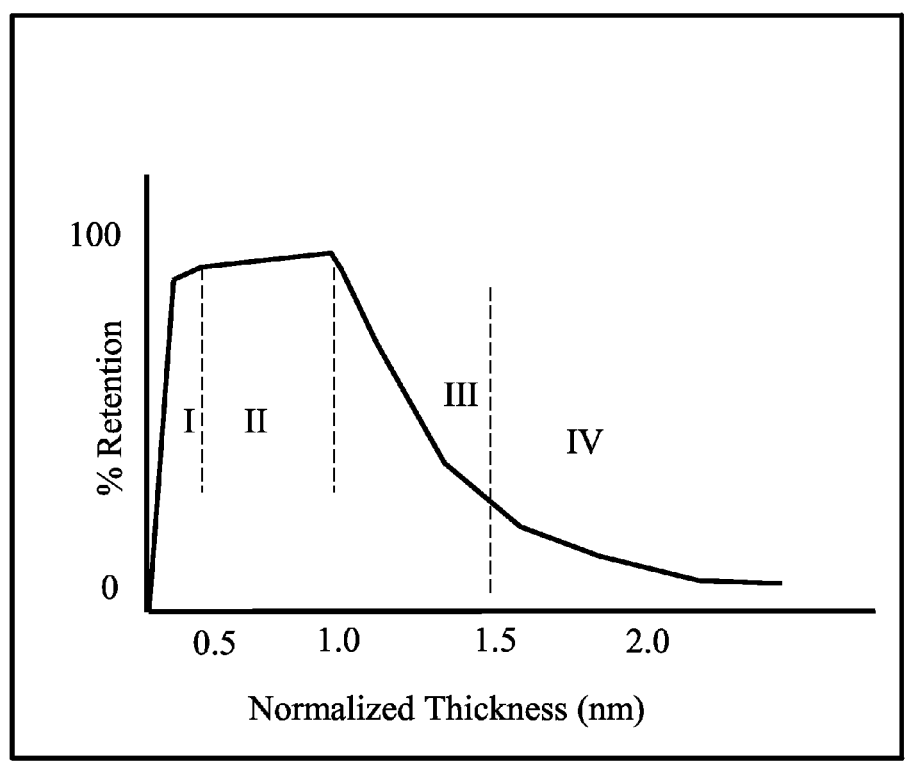

FIG. 5, which includes FIGS. 5A and 5B, illustrates a unidirectional resistive switching device with negligible retention in accordance with an embodiment of the invention. FIG. 5A illustrates a cross-sectional view of the unidirectional resistive switching device while FIG. 5B illustrates the retention as a function of the thickness of the switching layer of the unidirectional resistive switching device.

Referring to FIG. 5A, in one or more embodiments, the unidirectional resistive switching device 200 may be the first unidirectional resistive switching device 210 or the second unidirectional resistive switching device 220 described in FIG. 4.

As illustrated in FIG. 5A, the unidirectional resistive switching device 200 comprises a first electrode layer 130, a switching layer 150, and a second electrode layer 140.

The first electrode layer 130 may be an inert or active (participating in the switching mechanism) electrode, which forms the cathode of the device. The first electrode layer 130 may be formed as a bottom electrode of the resistive switching element in various embodiments.

In one or more embodiments, the switching layer 150 may comprise a layer that is capable of changing conduction from relatively low conductance to relatively high conductance. In various embodiments, the layer (switching layer 150) may comprise a chalcogenide material such as a germanium based chalcogenide, e.g., a copper doped $GeS_2$ layer. In an alternative embodiment, the layer may comprise silver doped $GeS_2$. In other embodiments, the layer may comprise copper doped $WO_3$, $Cu/Cu_2S$, $Cu/Ta_2O_5$, $Cu/SiO_2$, $Ag/Zn_xCd_{1-x}S$, $Cu/Zn_xCd_{1-x}S$, $Zn/Zn_xCd_{1-x}S$, GeTe, GST, As—S, $Zn_xCd_{1-x}S$, $TiO_2$, $ZrO_2$, $SiO_2$. In some embodiments, the switching layer 150 may comprise a plurality of layers and may include bilayers such as $Ge_xSe_y/SiO_x$, $Ge_xSe_y/Ta_2O_5$, $Cu_xS/Cu_xO$, $Cu_xS/SiO_2$ and combinations thereof.

In one embodiment, the switching layer 150 may comprise transition metal oxides which may change conductivity due to the formation of charged point defects such as oxygen vacancies, other charge complexes, or other mechanisms so as to increase or decrease conductivity in the layer. The switching layer 150 may comprise metal oxides such as hafnium oxide, gadolinium oxide, and other such materials doped with copper, silver, Te or other transition metals in various embodiments. In other examples, a metal oxide based switching layer 16 may comprise $NiO_x$, $TiO_x$, $Al_2O_3$, $Ta_2O_5$, $CuO_x$, $WO_x$, CoO, $Gd_2O_3$, $TiO_x$, $FeO_x$, chromium doped perovskite oxides such as $SrZrO_3$, $(Ba, Sr)TiO_3$, $SrTiO_3$, copper doped $MoO_x$, copper doped $Al_2O_3$, copper doped $ZrO_2$, Al doped ZnO, $Pr_{0.7}Ca_{0.3}MnO_3$, as examples.

The second electrode layer 140, which forms the anode, may comprise an electrochemically active metal such as silver, copper, zinc, Ti, Ta, alloys or layered structures of Cu and Te, alloys or layered structures of Ti and Te, alloys or layered structures of Ta and Te, and others in various embodiments. The second electrode layer 140 may also have a cap layer such as titanium nitride or tantalum nitride (as well as other suitable materials) in various embodiments.

The switching layer 150 may have a thickness T150 in various embodiments. In one or more embodiments, the thickness T150 of the switching layer 150 is larger than the thickness needed for a memory device. In various embodiments, for example, for a GeS based switching layer, the thickness of the switching layer 150 is at least 1.5× a corresponding thickness of the switching layer in a resistive switching memory device. In one or more embodiments, the thickness of the switching layer 150 is at least two times a corresponding thickness of the switching layer in a resistive switching memory device. In one or more embodiments, the thickness of the switching layer 150 is between 1.5× and three times a corresponding thickness of the switching layer in a resistive switching memory device.

In one or more embodiments, the thickness of the switching layer 150 is about 100 nm to about 150 nm. In one or more embodiments, the thickness of the switching layer 150 is about 100 nm to about 120 nm.

FIG. 5B illustrates retention of a resistive switching device as a function of the thickness of the switching layer in accordance with an embodiment of the present invention. FIG. 5B is a normalized plot in which the x value with the maximum retention is 1.0, in other words, the x-axis plots (thickness/thickness with maximum retention).

Referring to FIG. 5B, at very thin distances (captured by a first region I), the switching layer 150 does not have good retention. For example, the active atoms in the switching layer 150 may easily migrate to the active electrode layer as the thickness of the switching layer 150 compares favorably with the migration distance of the atoms. Further, at low voltages the leakage currents may be large due to tunneling through the switching layer 150. Thus, the difference between the high resistance state and the low resistance state deteriorates.

In contrast, when the thickness of the switching layer 150 is large as illustrated in a third region III of FIG. 5B, the conductive pathway (e.g., filament) formed after the programming of the cell is very nebulous (e.g., very thin). Consequently, applying a small amount of reverse voltage (voltage less than program voltage) may erase the conductive filament as the thin conductive pathway may break easily.

However, in an intermediate range illustrated by a second region II of FIG. 5B, the retention increases dramatically because the ON state is characterized by a thick conductive filament having a stable low resistance state while the OFF state is characterized by a high resistance of the switching layer 150. If the thickness is further increased into the fourth region IV, e.g., above 1.5 in one embodiment, the device may not program, i.e., switch.

Consequently, in various embodiments, the thickness of the switching layer 150 is selected to be within the third region III of FIG. 5B. This allows the formation of a resistive switching device having negligible retention. In various embodiments, the unidirectional resistive switching device described in FIG. 5 may be combined with another unidirectional resistive switching device to form a bidirectional switch.

Figure 6A:
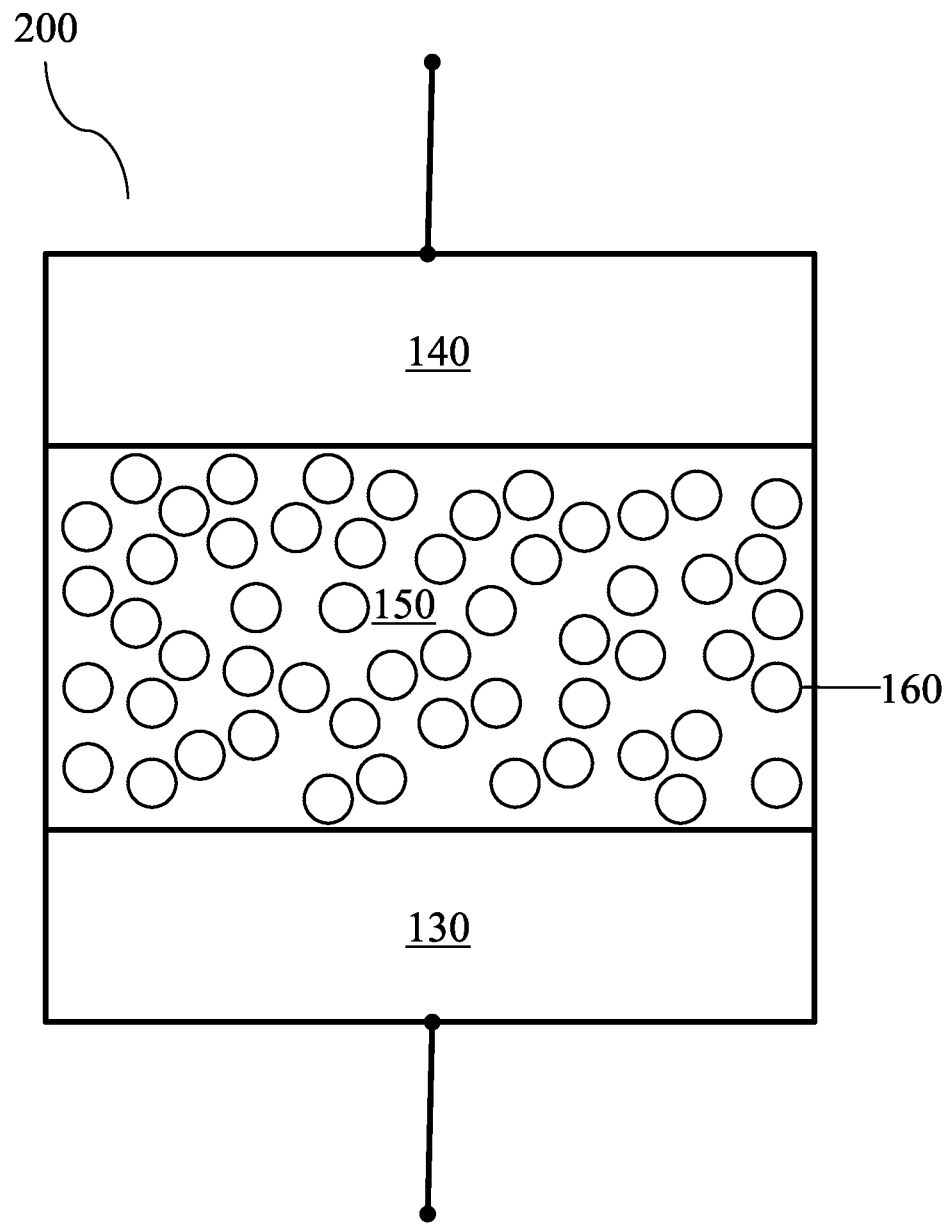
Figure 6B:
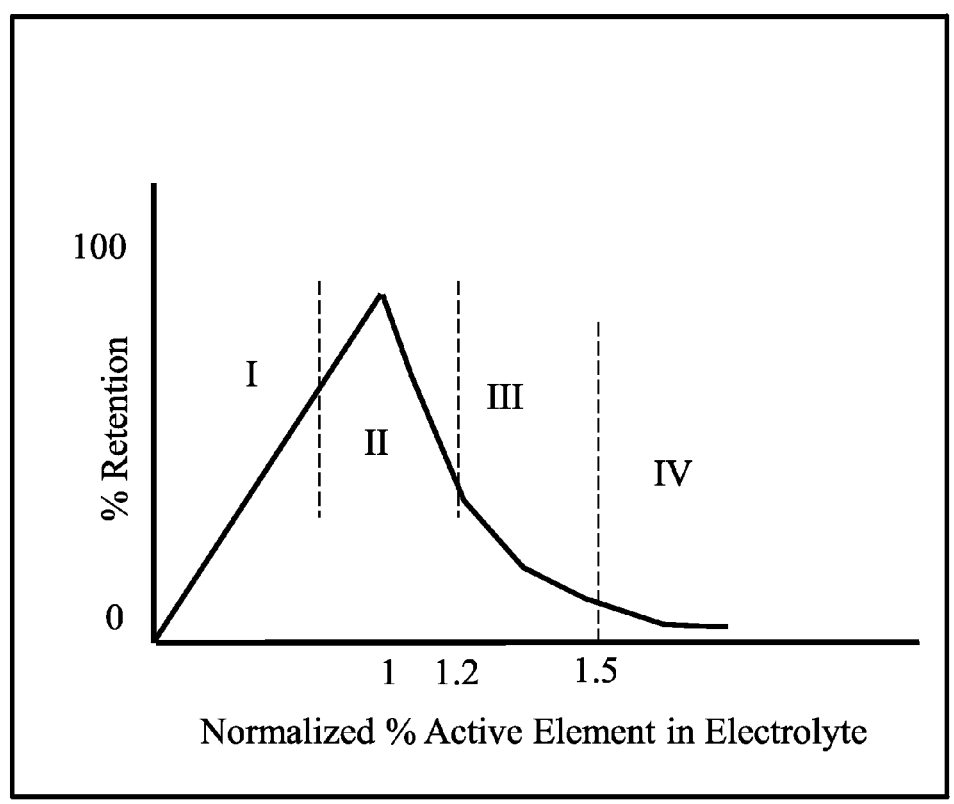

FIG. 6, which includes FIGS. 6A and 6B, illustrates a unidirectional resistive switching device with negligible retention in accordance with an embodiment of the invention. FIG. 6A illustrates a cross-sectional view of the unidirectional resistive switching device while FIG. 6B illustrates retention as a function of fractional active atomic concentration within the switching layer of the unidirectional resistive switching device.

As illustrated in FIG. 6A, the switching layer 150 may include nano-phases 160 in various embodiments. The nano-phases 160 may include clusters of atoms, for example, clusters of atoms of the active metal along with other crystal defects such as point defects. In various embodiments, the nano-phase 160 may be conductive.

Consequently, during programming, the active atoms from the active electrode layer (e.g., the second electrode layer 140) may diffuse into the switching layer 150 and may interconnect the conductive nano-phases 160 thereby forming a conductive pathway. During the erase process (or when a lower potential is applied), the active atoms may move back into the second electrode layer 140. If the initial concentration of the nano-phases 160 is very large, then the number of active atoms needed to be removed is small. Therefore, such a device will have poor retention. This is also illustrated in FIG. 6B. As illustrated in FIG. 6B, beyond 20% (e.g., number of atoms per unit volume of active metal to number of atoms per unit volume) atomic fraction of the active metal, the retention dramatically reduces. For example, the nano-phases may increase the effective diffusivity of the active atoms within the switching layer 150 thereby increasing the erase voltage (or reducing retention). Beyond a certain concentration, the switching layer 150 may become a conductive material, i.e., does not switch to a low resistance state.

Consequently, in various embodiments, the switching layer may be designed to have very less doping as in the first region I or in the third region III. In various embodiments, the atomic fraction of the active metal in the switching layer 150 is about 0-0.5 or about 1.2-1.5. Therefore, in various embodiments, for example, for a GeS based switching layer, atomic fraction of the active metal in the switching layer 150 is about 50% to about 60%, and about 55% in one case. Alternatively, in various embodiments, for example, for a GeS based switching layer, atomic fraction of the active metal in the switching layer 150 is about 0% to about 20%, and about 10% in one case.

Further, the nano-phases 160 are uniformly distributed within the switching layer 150 and not one single large cluster. Consequently, in various embodiments, the nano-phases 160 have an average size of about 50 atoms to about 500 atoms, and about 50 atoms to about 100 atoms in one or more embodiments. Additionally, in various embodiments, the nano-phases 160 have a diameter of about 5 nm to about 20 nm, and about 5 nm to about 10 nm in one or more embodiments.

In various embodiments, the unidirectional resistive switching device described in FIG. 6 may be combined with another unidirectional resistive switching device to form a bidirectional switch.

Figure 7A:
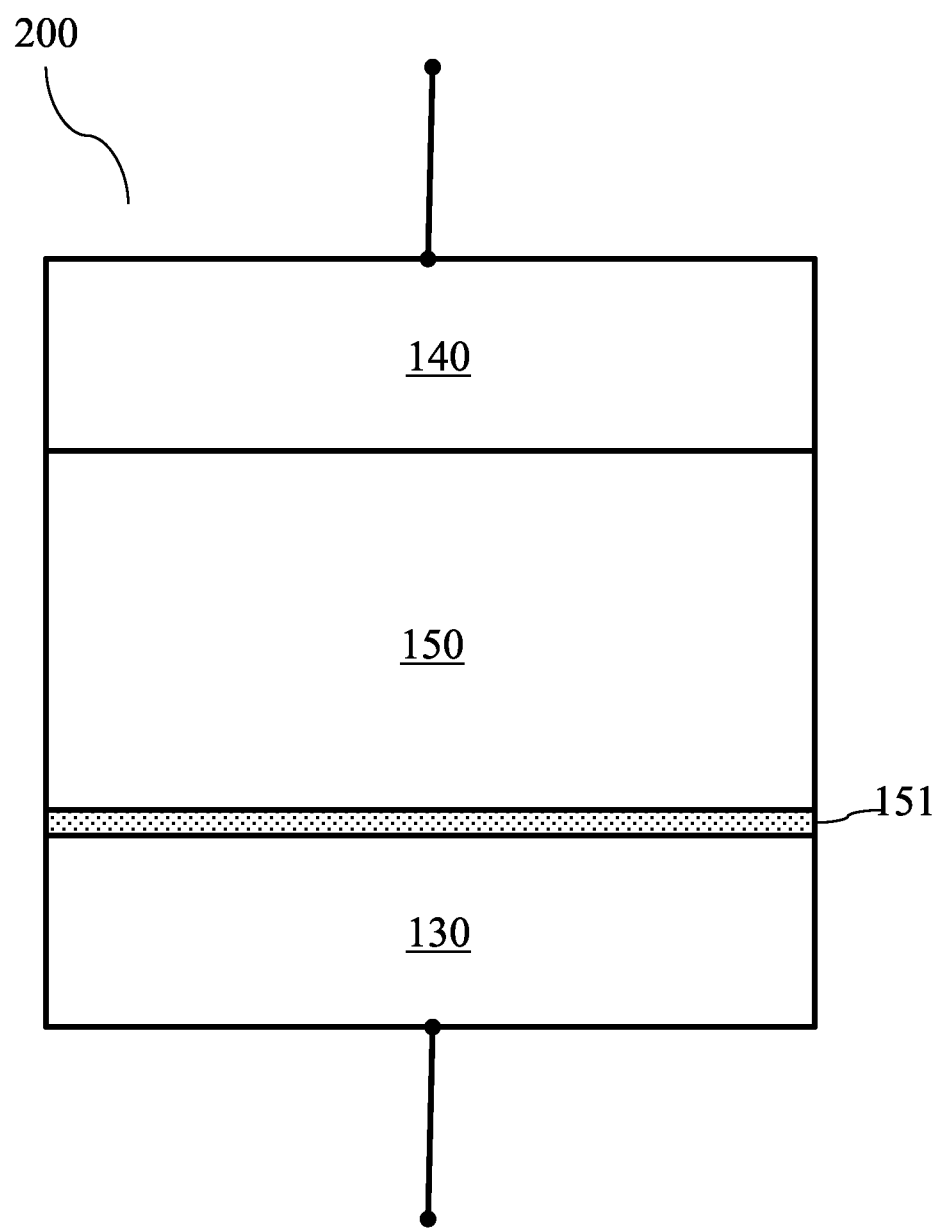
Figure 7B:
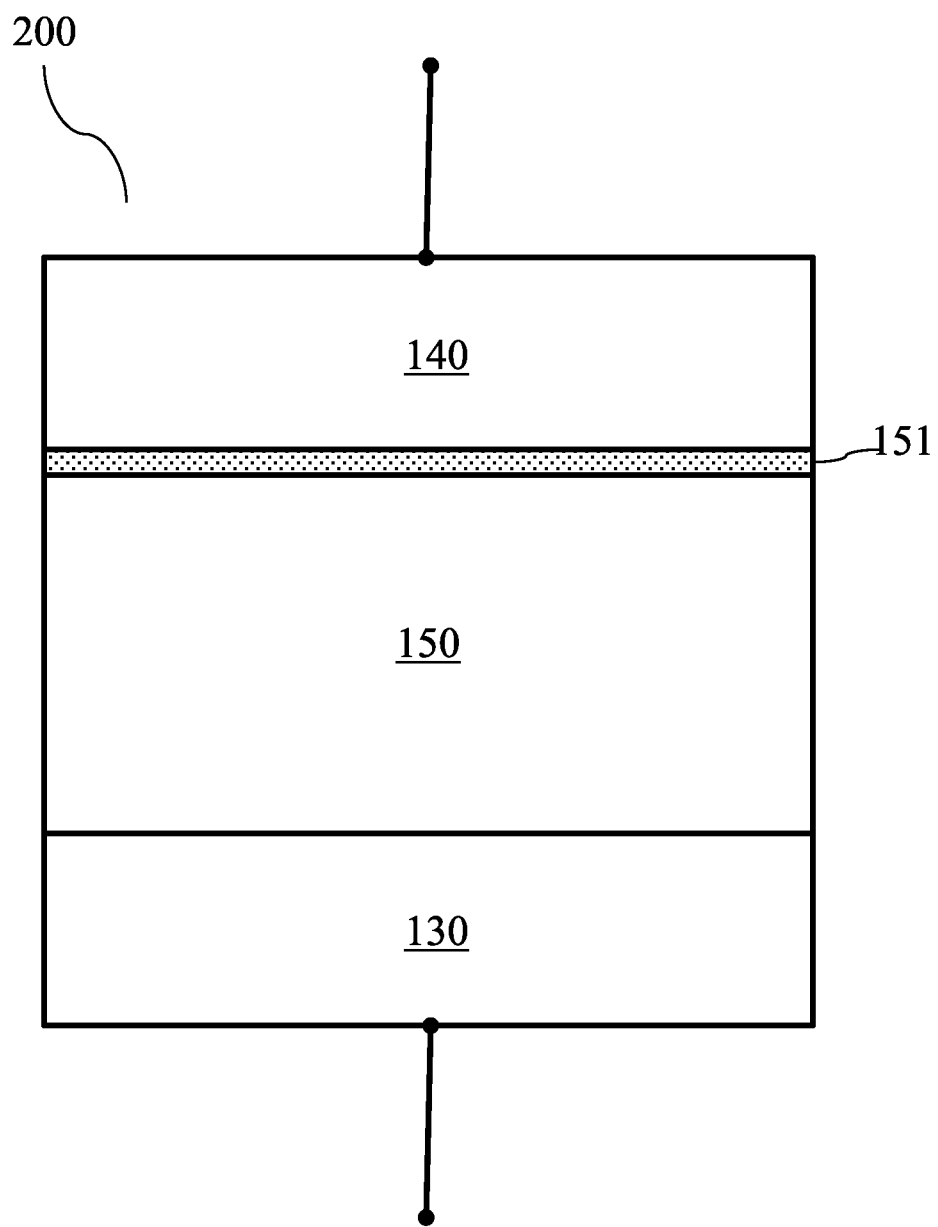
Figure 7C:
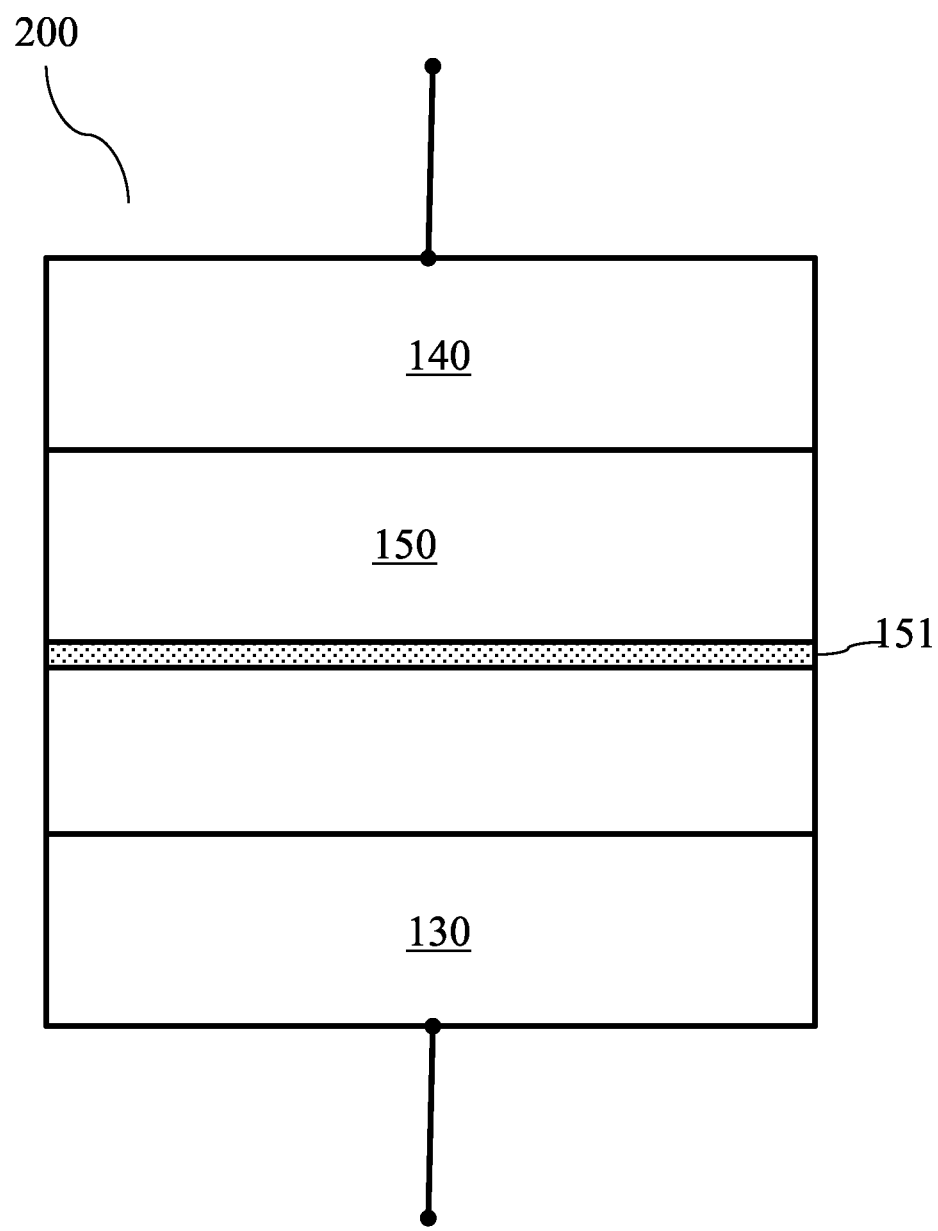
Figure 7D:
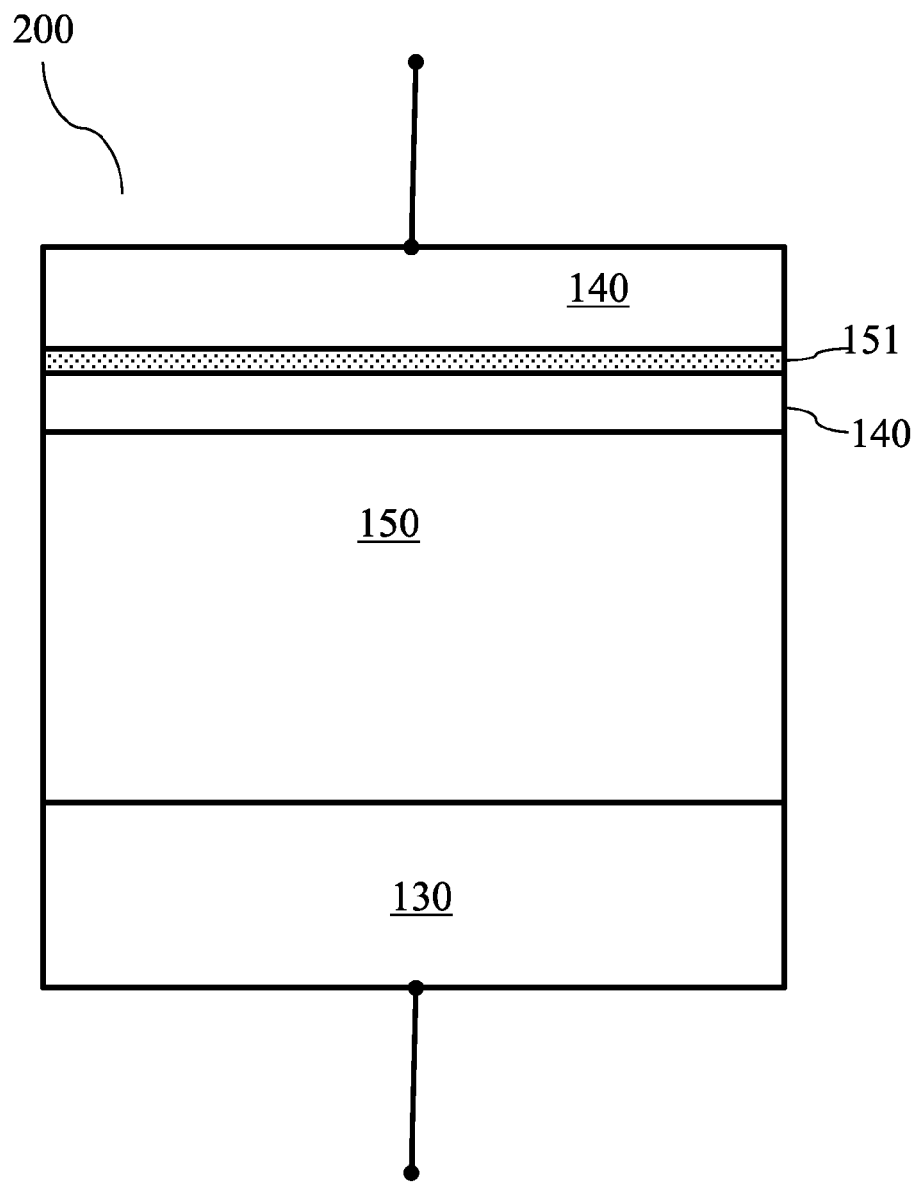
Figure 7E:
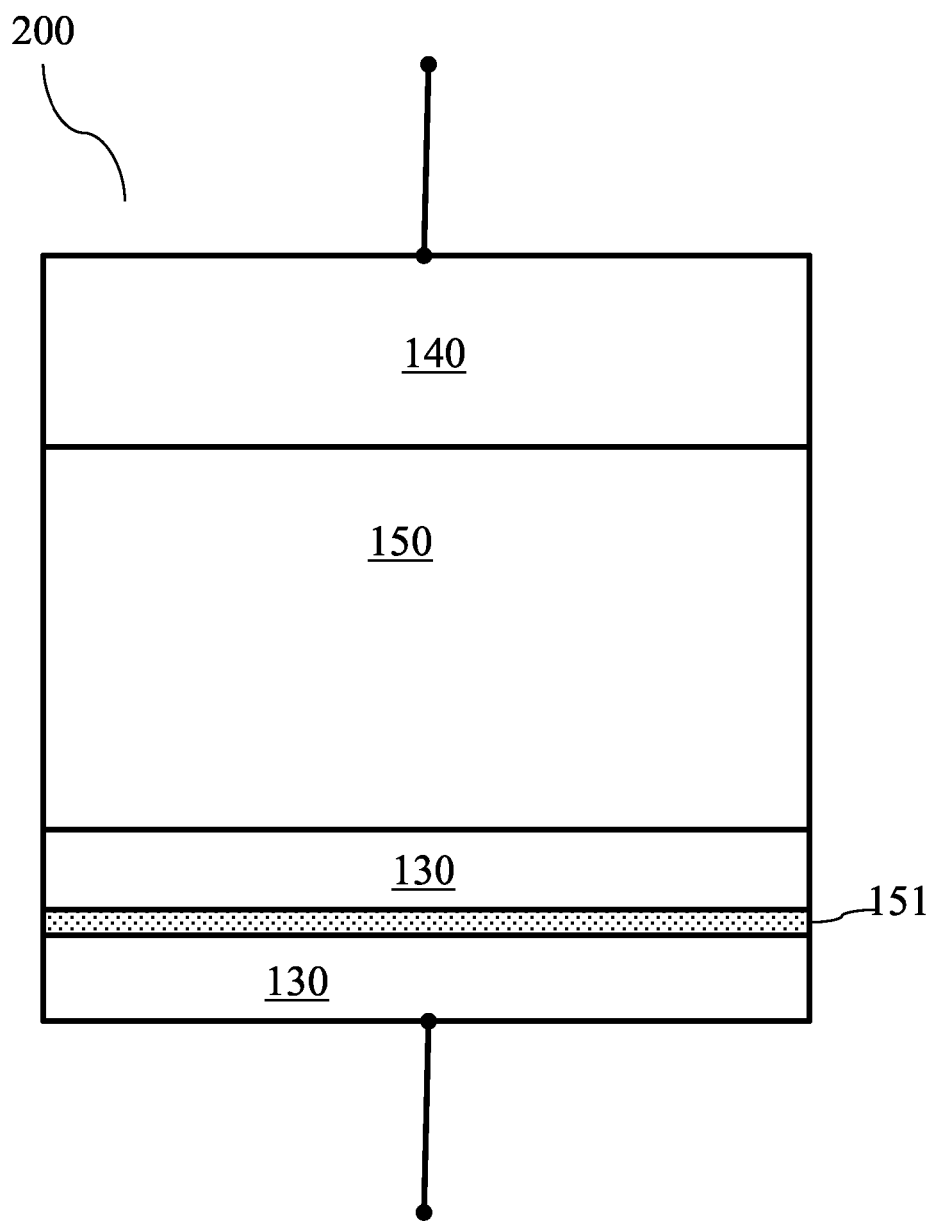
Figure 7F:
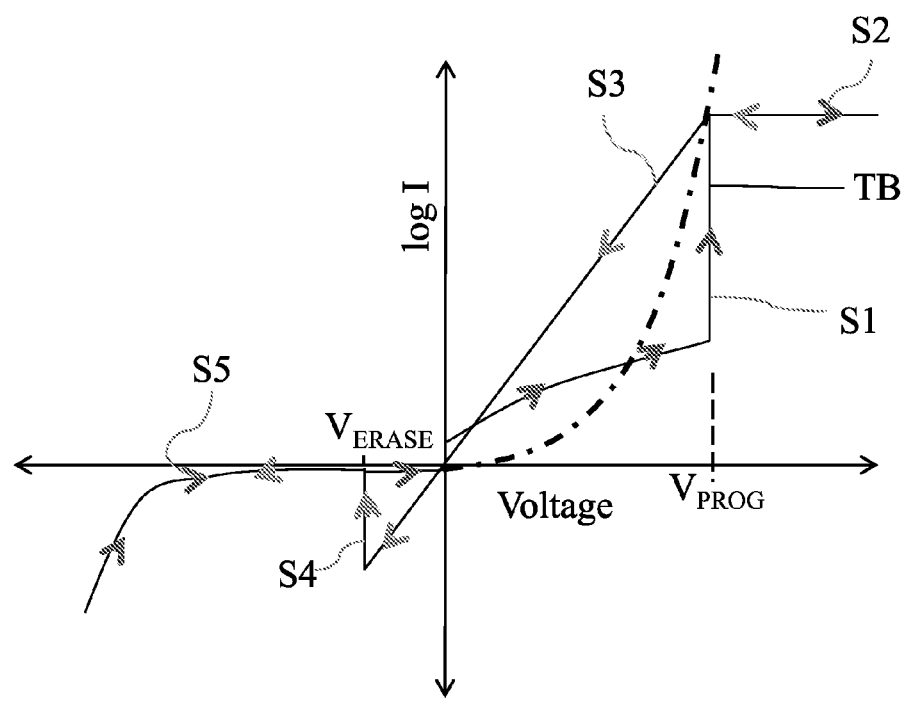

FIG. 7, which includes FIGS. 7A-7F, illustrates cross-sectional views of a unidirectional resistive switching device having a tunneling layer in accordance with an embodiment of the invention. FIGS. 7A-7E illustrate cross-sectional views of a unidirectional resistive switching device while FIG. 7F illustrates the current voltage relationship of the tunneling layer relative to the resistive switching layer.

In this embodiment, a tunneling layer 151 is introduced within the resistive switching layer. As illustrated in FIGS. 7A-7C, the tunneling layer 151 may introduced at the top, bottom or within the switching layer 150 in various embodiments. Further, the tunneling layer 151 may introduced within the first electrode layer 130 and/or the second electrode layer 140.

As illustrated in FIG. 7F, the tunneling layer 151 may be selected to provide a barrier to current flow when the voltage applied across the resistive switching layer is less than the program potential. This is because the current flowing through the tunneling layer 151 depends on the applied voltage, e.g., according to a power law. In other words, the tunneling layer 151 does not block the current when the applied voltage is higher than the program voltage. So, the current flowing through the resistive switching device is limited only by the current flowing through the switching layer 150. However, as illustrated in FIG. 7F, if the applied voltage is below the program voltage, the current flowing (TB) through the tunneling layer 151 may limit the current flowing through the resistive switching device. Therefore, the resulting device effectively behaves as a resistive switching device with negligible retention.

In various embodiments, the unidirectional resistive switching device described in FIG. 7 may be combined with another unidirectional resistive switching device to form a bidirectional switch.

Figure 8A:
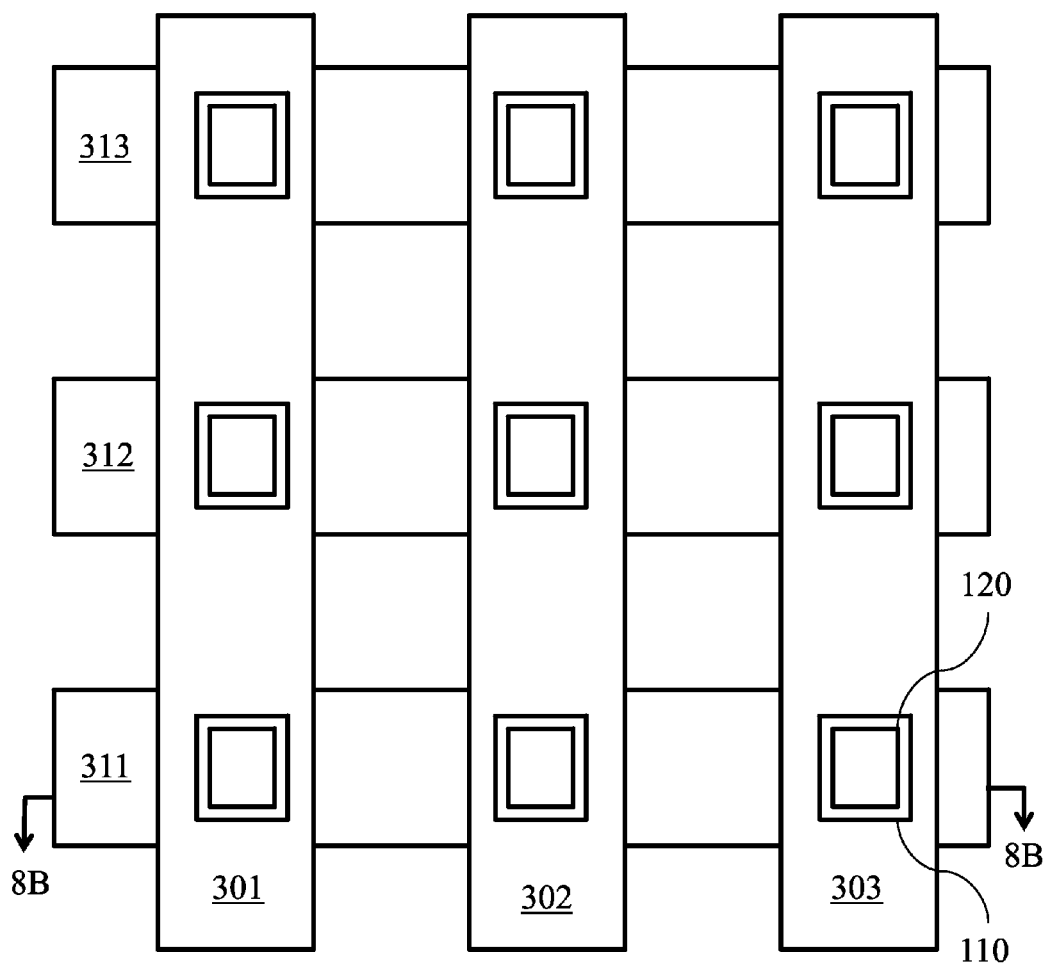
Figure 8B:
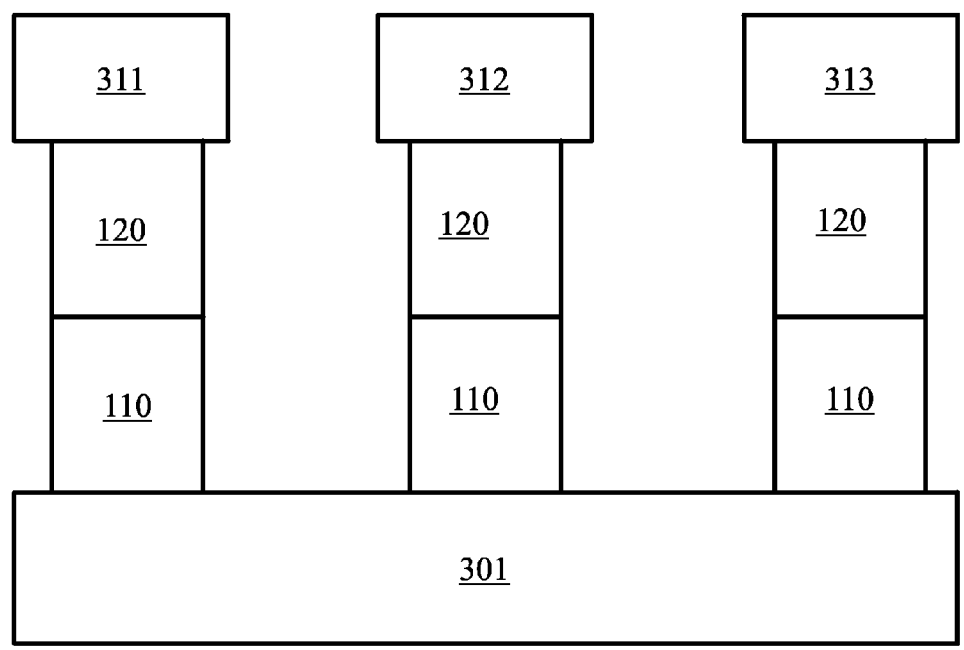

FIG. 8, which includes FIGS. 8A and 8B, illustrates a cross-point device array in accordance with embodiments of the present invention. FIG. 8A illustrates a top view and FIG. 8B illustrates a cross-sectional view.

FIG. 8 illustrates a cross-point device array, for example, as a stacked array. Each cell in the array may include an access device 110 and a memory device 120 (see also FIG. 8B). The memory device 120 may comprise a flash memory, a phase change memory, a resistive memory, a magnetic memory, a ferroelectric memory, or others, in various embodiments.

In one or more embodiments, the cross-point device array may be a memory array. In alternative embodiments, such arrays may also be used to form logic devices. Each memory device 120 in the cross-point device array is coupled between a first plurality of lines (e.g., a first, a second, and a third vertical line 301, 302, and 303) and a second plurality of lines (e.g., a first, a second, and a third horizontal line 311, 312, and 313). The first and the second plurality of lines may be perpendicular to each other in one embodiment. The first plurality of lines may be a metal level immediately above or below the second plurality of lines.

Each memory device 120 may be coupled between a line of the first plurality of lines in a first metal level and a line of the second plurality of lines in a metal level vertically above or below the first metal level. For example, one of the access device 110 and one of the memory device 120 is coupled between the first vertical line 301 and the first horizontal line 311.

Figure 9A:
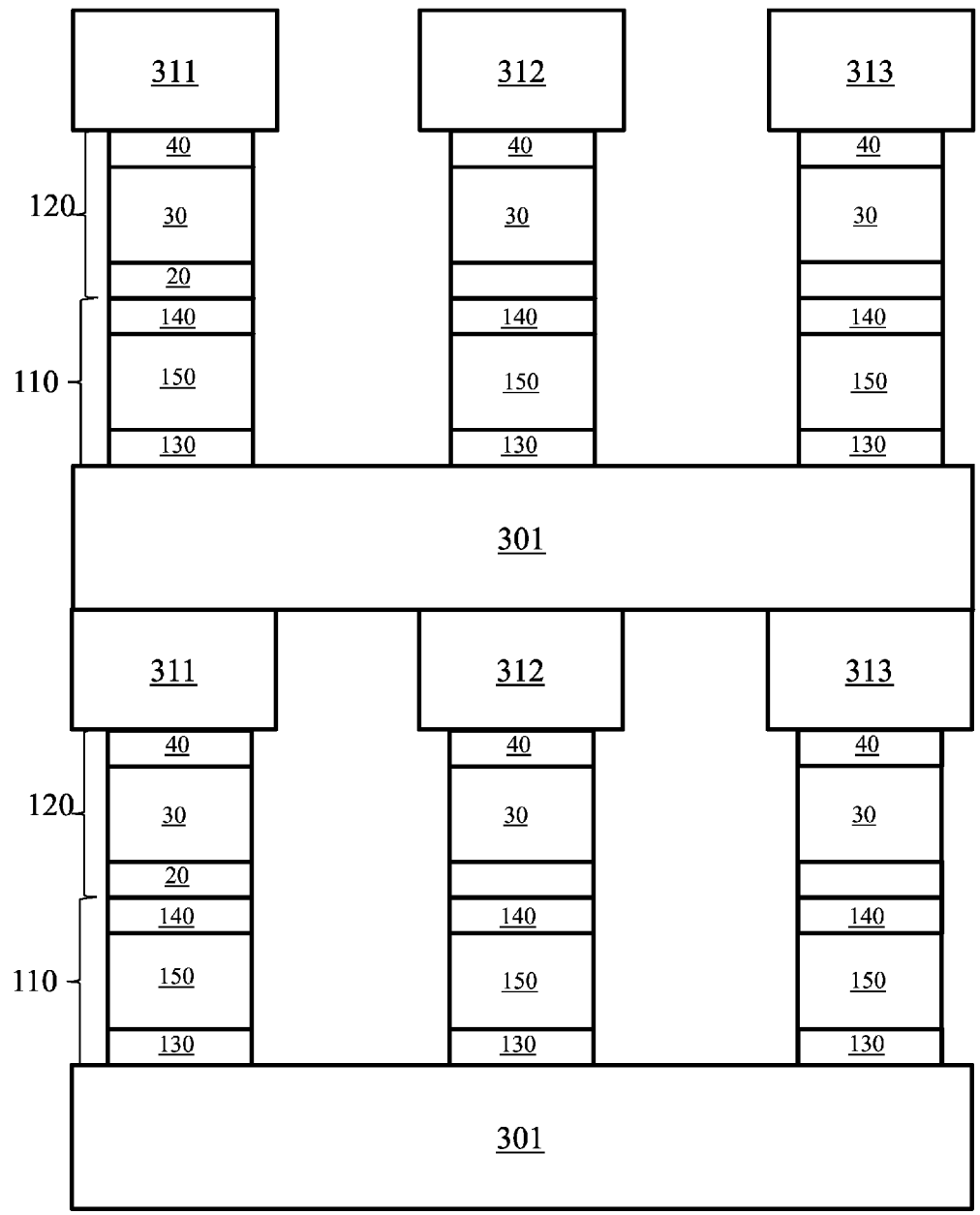
Figure 9B:
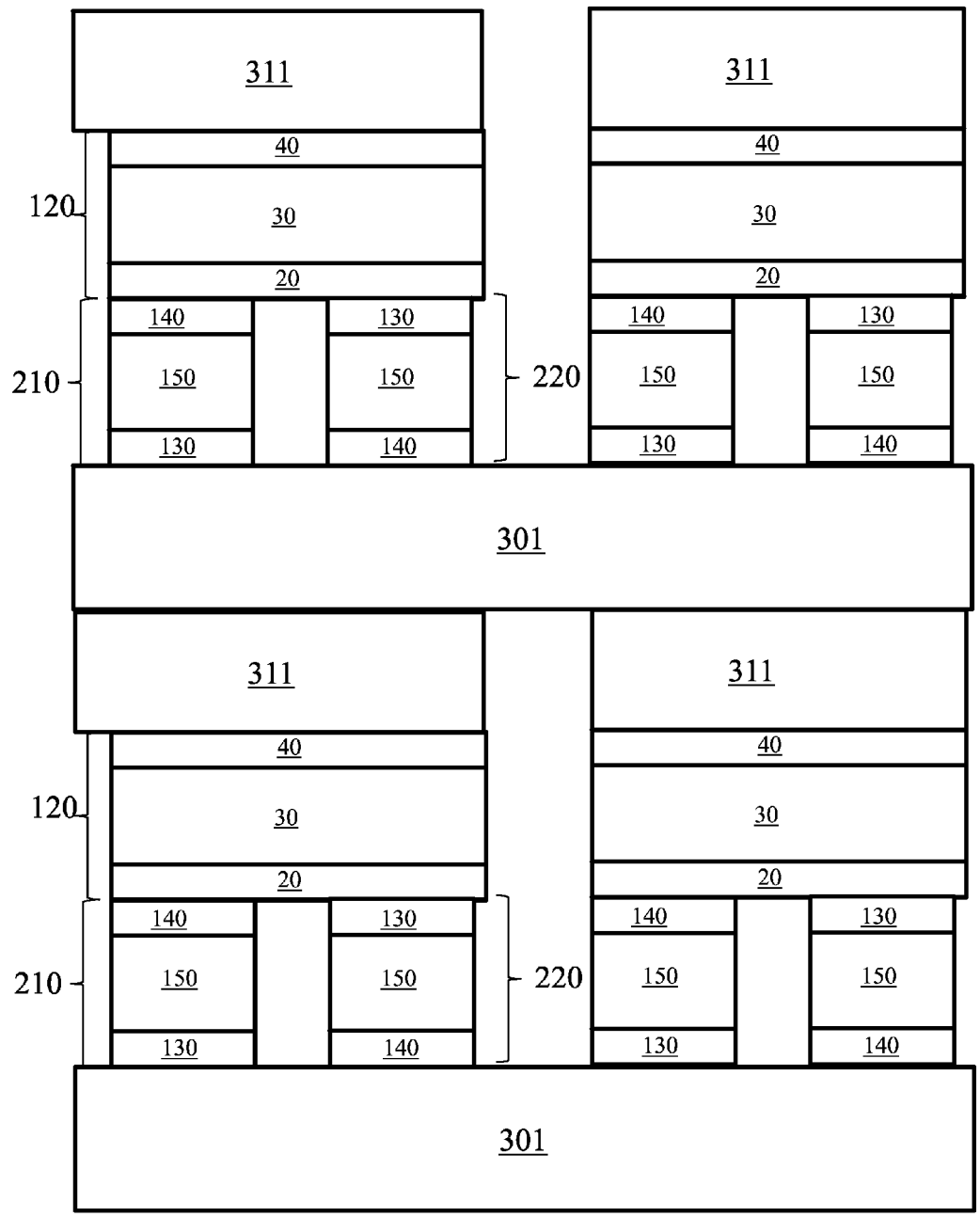

FIG. 9, which includes FIGS. 9A and 9B, illustrates cross-sectional views of the cross-point device array in accordance with embodiments of the invention.

As illustrated in FIG. 9A, each access device 110 may include a first electrode layer 130, a switching layer 150, and a second electrode layer 140. Similarly, each memory device 120 may include a first conductive layer 20, a variable resistance layer 30, and a second conductive layer 40.

FIG. 9B illustrates an alternative embodiment in which the access device 110 includes two resistive switching devices coupled in anti-parallel. In this embodiment, the access device 110 behaves as a bidirectional device as described above with respect to FIG. 4. For example, a first unidirectional resistive switching device 210 and a second unidirectional resistive switching device 220 as described with respect to FIG. 4 are illustrated.

As illustrated in FIG. 9, multiple levels may be formed within the cross-point device array. In the illustrations, two levels are illustrated for simplicity. However, in various embodiments, more than two levels of devices may be formed in a stacked cross-point device array.

The access device 110 in FIGS. 9A and 9B may be fabricated using the embodiments described with respect to FIGS. 5-7. As an illustration, the thickness of the switching layer 150 is at least two times a corresponding thickness of the variable resistance layer 30. Similarly, in another embodiment, the number of active atoms in the switching layer 150 is greater than a number of active atoms in the variable resistance layer 30 of the memory device 120. In one embodiment, the number of active atoms in the switching layer 150 is at least 1.5 times more than a number of active atoms in the variable resistance layer 30. In one alternative embodiment, the number of active atoms in the switching layer 150 is less than 0.5 times than a number of active atoms in the variable resistance layer 30.

Figure 10A:
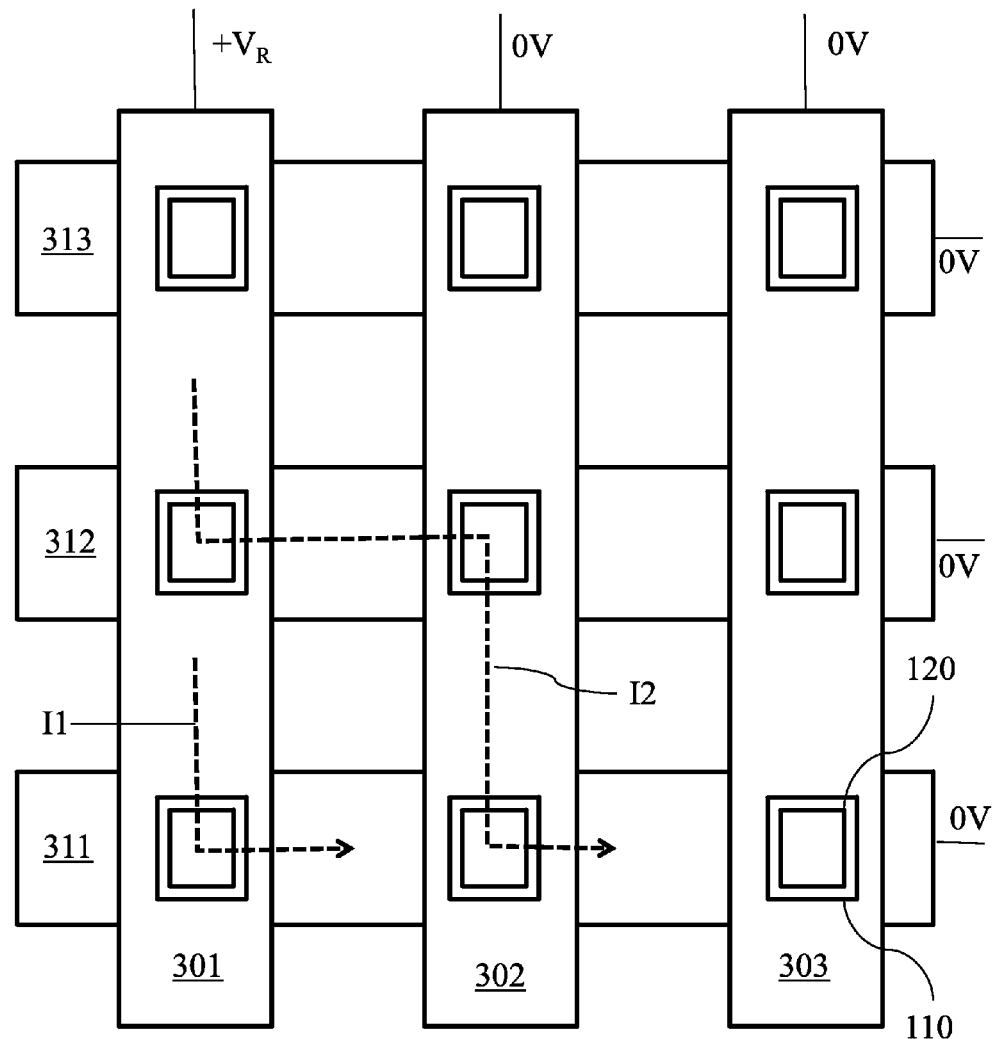
Figure 10B:
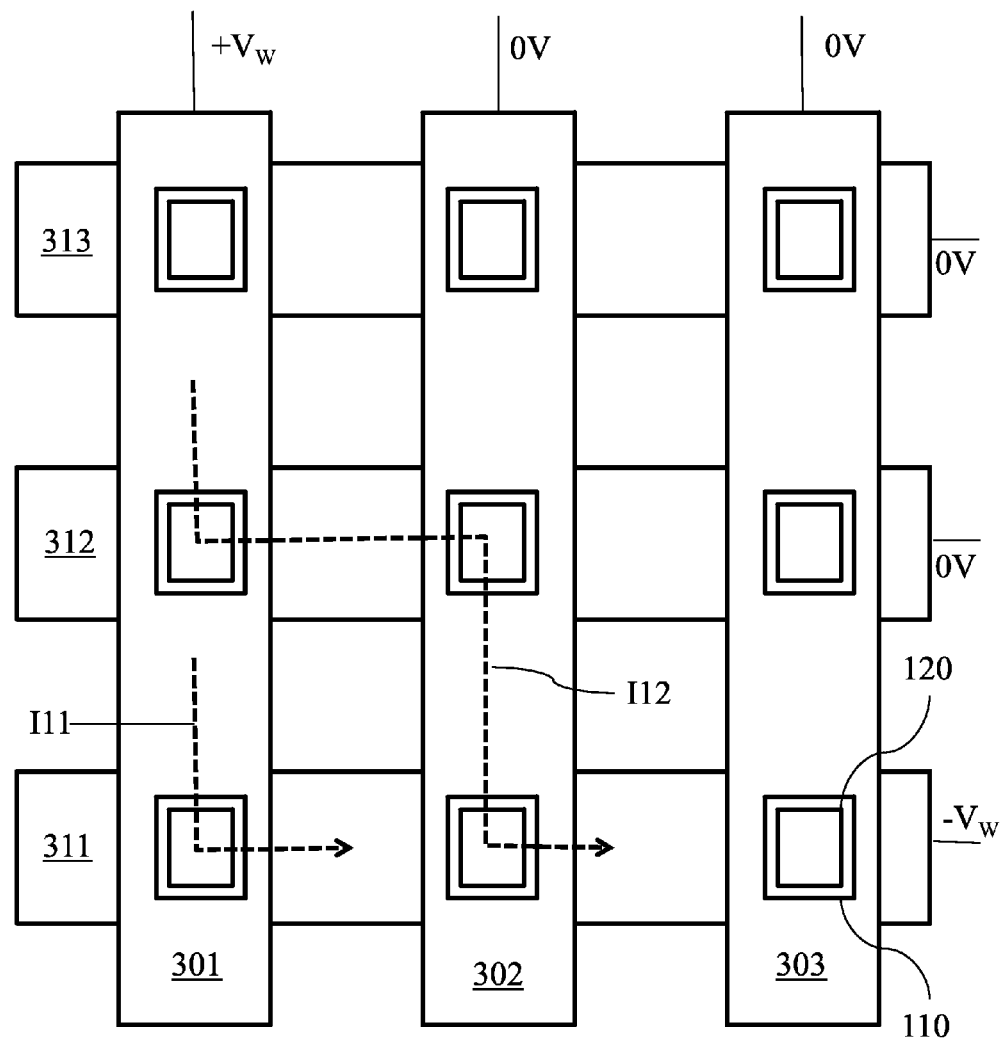

FIG. 10, which includes FIGS. 10A and 10B, illustrates the cross-point memory array during operation. FIG. 10A illustrates a read operation while FIG. 10B illustrates a write operation.

During a read operation, a read voltage may be applied across a selected first vertical line 301. The read current I1 flowing through the first vertical line 301 into the first horizontal line 311 indicates the state of the memory device at the intersection of the first vertical line 301 with the first horizontal line 311. However, spurious leakage currents may also flow through other pathways, for example, a leakage current I2 is illustrated. As described in various embodiments, the access devices have a non-linear behavior in which the access device shuts off if the voltage across the access device is lower than the program voltage. Thus, the non-linear behavior of the access devices at the intersection of the second vertical line 302 and the second horizontal line 312 as well as the access devices at the intersection of the second vertical line 302 and the first horizontal line 311 ensures that such sneak paths are turned off.

Similarly, as illustrated in FIG. 10B, during the write operation, most of the current flows through the primary path Ill and not through the secondary pathways 112, e.g., because the access devices at the intersection of the second vertical line 302 and the second horizontal line 312 is turned off. This may prevent accidental writing of other devices.

Figure 11:
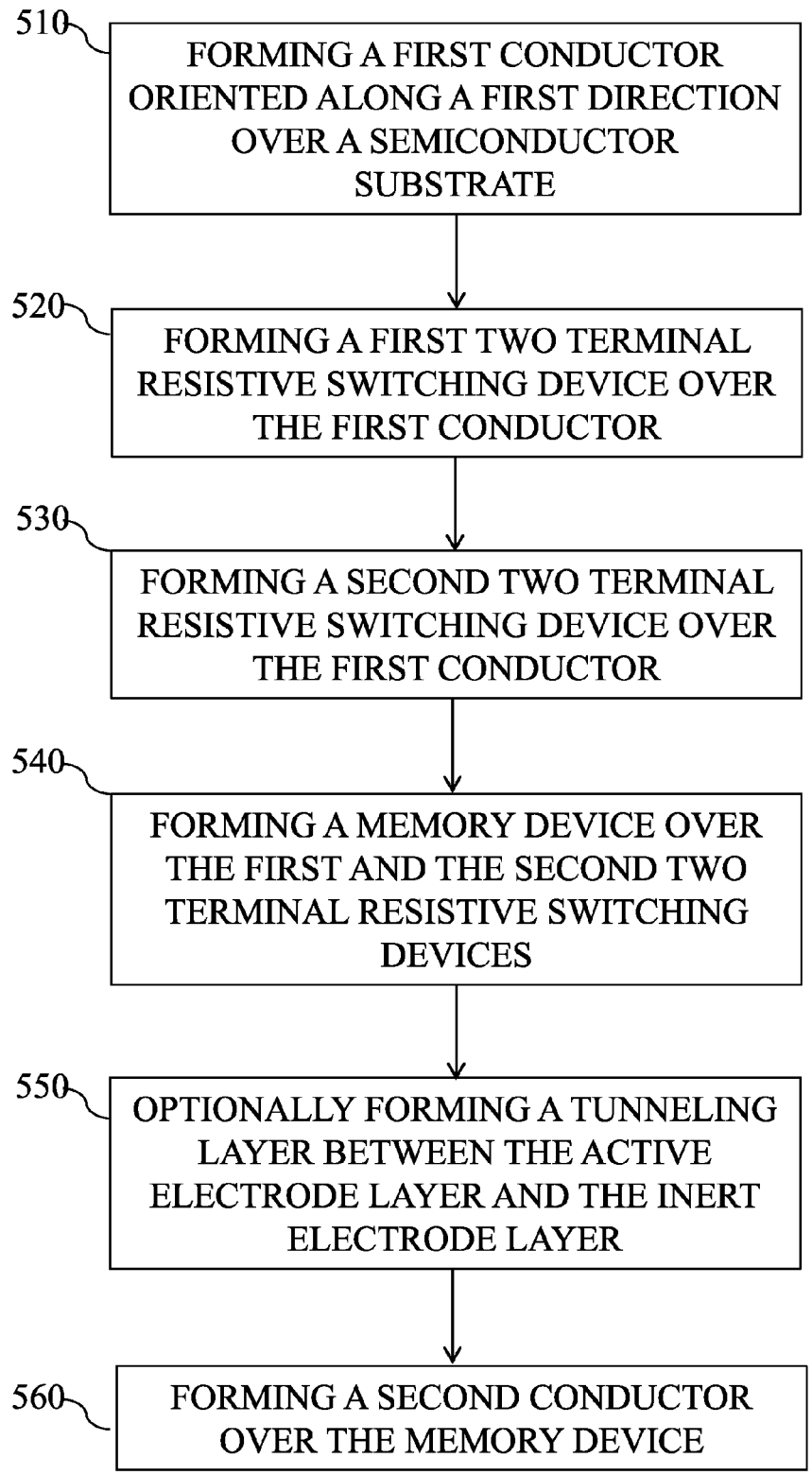
FIG. 11 illustrates an embodiment of fabricating the resistive switching device array in various embodiments of the invention.

FIG. 11 illustrates an embodiment of fabricating the resistive switching device array in various embodiments of the invention. FIG. 11 illustrates an embodiment of forming a device illustrated in FIG. 9B.

Referring to FIG. 11 and box 510, a first conductor is formed over a semiconductor substrate. The first conductor may be oriented along a first direction. See e.g., FIG. 9, showing first vertical line 301.

As next illustrated in box 520, a first two terminal resistive switching device (first unidirectional resistive switching device 210 in FIG. 9B) having a cathode terminal and an anode terminal is formed over this first vertical line 301.

Referring to box 530, a second two terminal resistive switching device (second unidirectional resistive switching device 220 in FIG. 9B) having a cathode terminal and an anode terminal. The anode terminal of the first two terminal resistive switching device and the cathode terminal of the second two terminal resistive switching device are coupled to the first vertical line 301.

The first two terminal resistive switching device and the second two terminal resistive switching device may be formed sequentially in one embodiment, for example, by patterning and masking one of the regions and depositing an inert electrode, a switching layer and an active layer to form the first two terminal resistive switching device. Then after masking the first two terminal resistive switching device, the second two terminal resistive switching device may be formed by depositing an active electrode, a switching layer, and an inert electrode. In both the first and the second two terminal resistive switching devices, an optional tunneling layer may be deposited between the inert electrode and the active electrode.

Referring to box 540, a memory device 120 having a first node and a second node is formed over the first and the second two terminal resistive switching devices 210 and 220 (see also FIG. 9B). The first node to the cathode terminal of the first two terminal resistive switching device and the anode terminal of the second two terminal resistive switching device are coupled together, for example, through the first conductive layer 20 (FIG. 9B).

As illustrated in box 550, in some embodiments, a tunneling layer may be formed between the inert electrode and the active electrode, for example, as illustrated in FIG. 7.

Referring to box 560, a second conductor (a first horizontal line 311) is formed over the memory device 120. The second conductor is oriented along a second direction perpendicular to the first direction. The second node of the memory device 120 is coupled to the first horizontal line 311.

Figure 12:
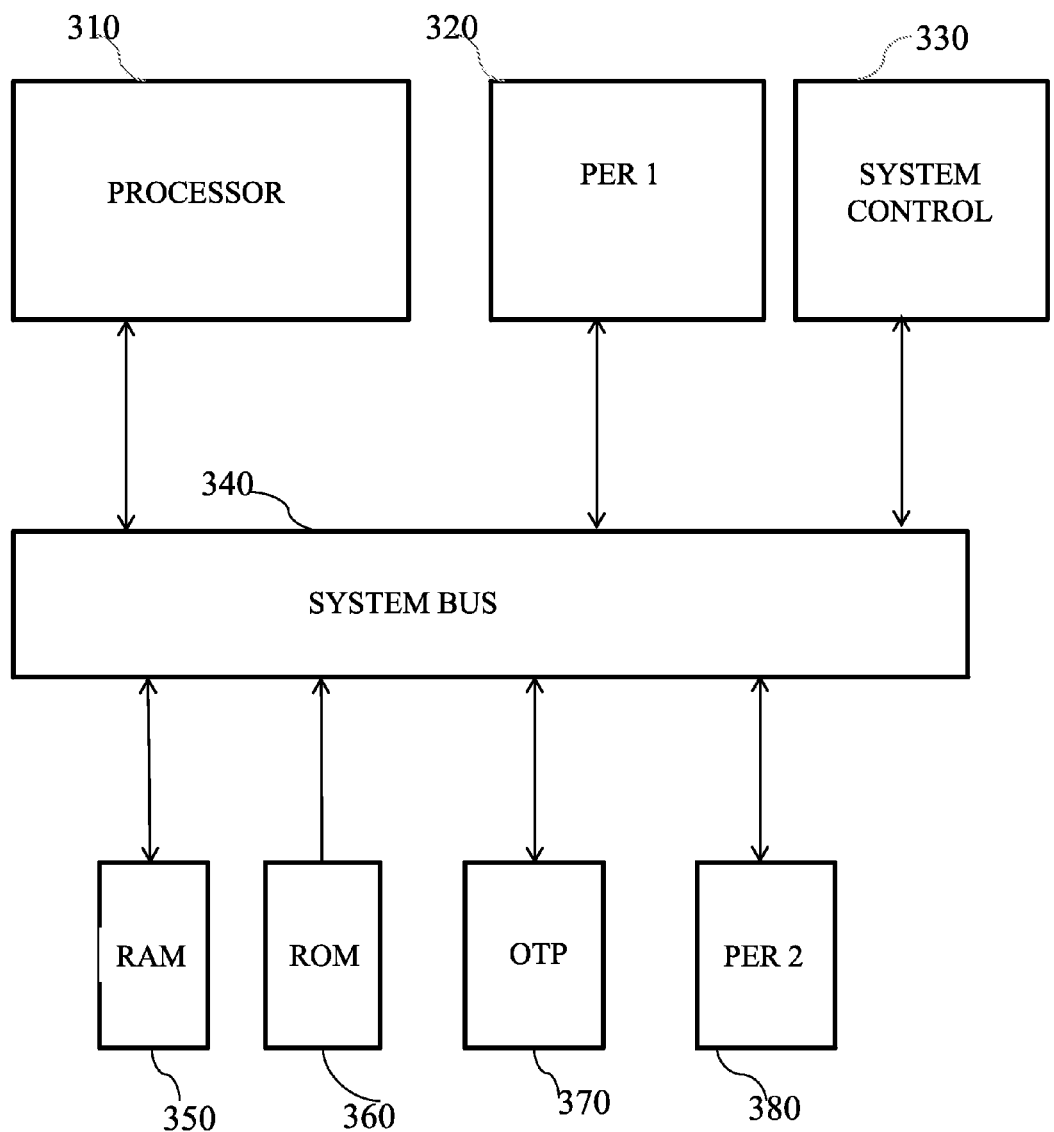
FIG. 12 illustrates a system using embodiments of the present invention.

FIG. 12 illustrates a system using embodiments of the present invention.

The cross-point device array may be used to form different types of memories in one or more embodiments. In one or more embodiments, the embodiments described in the present invention may be standalone memories or embedded memories, for example, within a system on chip architecture.

Embodiments of the present invention may be part of a system, which may include a processor 310, a peripheral device (PER) 320, a system control unit 330, a system bus 340, a random access memory (RAM) 350, a read only memory (ROM) 360, an one-time programmable memory (OTP) 370, and a input/output (I/O) device 380.

The various components of the system may communicate through the system bus 340. The peripheral devices such as PER 320 may include many different types of devices including displays, keyboard, mouse, sensors, camera, and others. The I/O devices such as the I/O 380 may include transmitter and receivers for receiving wired or wireless communications.

In various embodiments, the PER 320, the RAM 350, the ROM 360, the OTP 370, and/or I/O 380 may include a memory cell as described in various embodiments of the present invention. Further, the processor 310, system control unit 330 may also include bidirectional resistive switching access devices, for example, as embedded memory, as described in various embodiments of the present invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 2-9, 11 may be combined with each other in alternative embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A switching device comprising:
a memory device disposed over a substrate; and
a two terminal access device disposed over the substrate and coupled to the memory device, the two terminal access device comprising a two terminal resistive switching device, wherein the two terminal resistive switching device comprises
an active electrode layer,
an inert electrode layer,
a switching layer disposed between the active electrode layer and the inert electrode layer, and
a tunneling layer disposed between the active electrode layer and the inert electrode layer.

2. The switching device of claim 1, wherein the two terminal resistive switching device comprises a conductive bridging device.

3. The switching device of claim 2, wherein the tunneling layer is disposed between the switching layer and the inert electrode layer.

4. The switching device of claim 2, wherein the tunneling layer is disposed between the switching layer and the active electrode layer.

5. The switching device of claim 1, wherein the tunneling layer comprises aluminum oxide or zirconium oxide.

6. The switching device of claim 1, wherein the switching device comprises a cross-point array, wherein the inert electrode layer is coupled to a first metal line disposed below the two terminal access device and the memory device, wherein a terminal of the memory device is coupled to a second metal line disposed over the two terminal access device and the memory device.

7. The switching device of claim 6, wherein the cross-point array further comprises:
a second memory device disposed over a substrate; and
a second two terminal access device disposed over the substrate and coupled to the second memory device, the second two terminal access device comprising a second two terminal resistive switching device, wherein the second two terminal resistive switching device comprises
a second active electrode layer,
a second inert electrode layer,
a second switching layer disposed between the second active electrode layer and the second inert electrode layer, and
a second tunneling layer disposed between the second active electrode layer and the second inert electrode layer, wherein the second inert electrode layer is coupled to the second metal line.

8. A device array comprising:
a first conductor oriented along a first direction;
a second conductor oriented along the first direction;
a third conductor oriented along a second direction perpendicular to the first direction;
a first two terminal resistive switching device having a cathode terminal and an anode terminal;
a first memory device having a first node and a second node, wherein the first node of the first memory device is coupled to the cathode terminal of the first two terminal resistive switching device, wherein the anode terminal of the first two terminal resistive switching device is coupled to the first conductor, and wherein the second node of the first memory device is coupled to the second conductor;
a second two terminal resistive switching device having a cathode terminal and an anode terminal; and
a second memory device having a first node and a second node, wherein the first node of the second memory device is coupled to the cathode terminal of the second two terminal resistive switching device, wherein the anode terminal of the second two terminal resistive switching device is coupled to the second conductor, and wherein the second node of the second memory device is coupled to the third conductor, wherein the first and the second two terminal resistive switching devices each comprise:
an active electrode layer;
an inert electrode layer;
a switching layer disposed between the active electrode layer and the inert electrode layer; and
a tunneling layer disposed between the active electrode layer and the inert electrode layer.

9. The device array of claim 8, wherein each of the first two terminal resistive switching device and the second two terminal resistive switching device comprise a conductive bridging device.

10. The device array of claim 8, wherein the tunneling layer is disposed between the switching layer and the inert electrode layer.

11. The device array of claim 8, wherein the tunneling layer is disposed between the switching layer and the active electrode layer.

12. The device array of claim 8, wherein the tunneling layer comprises aluminum oxide or zirconium oxide.

13. The device array of claim 8, wherein the device array is a cross point array.

* * * * *